(12) United States Patent
Park

(10) Patent No.: US 11,930,656 B2
(45) Date of Patent: *Mar. 12, 2024

(54) FOLDABLE DISPLAY DEVICE

(71) Applicant: Samsung Display Co., Ltd., Yongin-si (KR)

(72) Inventor: Myoung Seo Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/088,605

(22) Filed: Dec. 25, 2022

(65) Prior Publication Data

US 2023/0126630 A1    Apr. 27, 2023

Related U.S. Application Data

(63) Continuation of application No. 17/151,194, filed on Jan. 17, 2021, now Pat. No. 11,539,024, which is a
(Continued)

(30) Foreign Application Priority Data

Apr. 26, 2018 (KR) .................. 10-2018-0048776

(51) Int. Cl.
*H01L 51/50* (2006.01)
*H05K 5/00* (2006.01)
(Continued)

(52) U.S. Cl.
CPC ....... *H10K 50/8426* (2023.02); *H05K 5/0017* (2013.01); *H05K 5/0226* (2013.01);
(Continued)

(58) Field of Classification Search
CPC ... H10K 50/8426; H10K 59/12; H10K 77/111
See application file for complete search history.

(56) References Cited

U.S. PATENT DOCUMENTS 9,029,846 B2    5/2015    Song et al.
9,661,719 B2    5/2017    Jang et al.
(Continued)

FOREIGN PATENT DOCUMENTS

CN    104241316    12/2014
CN    105679189    6/2016
(Continued)

OTHER PUBLICATIONS

Extended European Search Report dated Oct. 9, 2019, issued in European Patent Application No. 19171173.8. (copy in parent appl.).
(Continued)

*Primary Examiner* — Anthony Ho
(74) *Attorney, Agent, or Firm* — H.C. Park & Associates, PLC

(57) ABSTRACT

A foldable display device assembly includes a rigid film having first and second sections spaced apart from each other, the rigid film being foldable about a folding axis disposed between the first and second sections of the rigid film; an adhesion structure having first and second adhesion sections spaced apart from each other, the first and second adhesion sections being disposed on the first and second sections of the rigid film, respectively; a lower flexible module disposed on the adhesion structure; a flexible display module disposed on the lower flexible module; and an upper flexible module disposed on the flexible display module.

16 Claims, 23 Drawing Sheets

Related U.S. Application Data continuation of application No. 16/353,336, filed on Mar. 14, 2019, now Pat. No. 10,930,883.

(51) Int. Cl.

| | | |
|---|---|---|
| *H05K 5/02* | (2006.01) | |
| *H10K 50/842* | (2023.01) | |
| *H10K 77/10* | (2023.01) | |
| *H10K 59/12* | (2023.01) | |
| *H10K 102/00* | (2023.01) | |

(52) U.S. Cl.
 CPC ............ *H10K 77/111* (2023.02); *H10K 59/12* (2023.02); *H10K 2102/311* (2023.02)

(56) References Cited

U.S. PATENT DOCUMENTS

| | | | |
|---|---|---|---|
| 9,983,424 | B2 | 5/2018 | Kim et al. |
| 10,074,824 | B2 | 9/2018 | Han et al. |
| 10,930,883 | B2 * | 2/2021 | Park .................. G06F 1/203 |
| 11,024,828 | B2 | 6/2021 | Kim et al. |
| 11,539,024 | B2 * | 12/2022 | Park .................. H10K 77/111 |
| 2010/0308335 | A1 | 12/2010 | Kim et al. |
| 2015/0266272 | A1 | 9/2015 | Lee et al. |
| 2016/0165697 | A1 | 6/2016 | Jang et al. |
| 2016/0209874 | A1 | 7/2016 | Choi et al. |
| 2016/0212890 | A1 | 7/2016 | Jeong et al. |
| 2016/0291783 | A1 | 10/2016 | Cotton et al. |
| 2016/0357052 | A1 | 12/2016 | Kim et al. |
| 2017/0196078 | A1 | 7/2017 | Choi et al. |
| 2017/0352834 | A1 | 12/2017 | Kim et al. |
| 2018/0070460 | A1 | 3/2018 | Han |

FOREIGN PATENT DOCUMENTS

| | | |
|---|---|---|
| CN | 106252378 | 12/2016 |
| CN | 107195253 | 9/2017 |
| CN | 107464887 | 12/2017 |
| CN | 107507518 | 12/2017 |
| CN | 207008995 | 2/2018 |
| CN | 107886846 | 4/2018 |
| KR | 2010-0130898 | 12/2010 |
| KR | 2016-0089583 | 7/2016 |
| KR | 10-2016-0144912 | 12/2016 |
| KR | 2017-0137984 | 12/2017 |
| KR | 10-2018-0036323 | 4/2018 |

OTHER PUBLICATIONS

Notice of Allowance dated Oct. 9, 2020, in U.S. Appl. No. 16/353,336. (copy in parent appl.).

Office Action dated Mar. 25, 2022 for Korean Patent Application No. 10-2018-0048776 (copy in parent appl.).

Notice of Allowance dated Aug. 24, 2022, in U.S. Appl. No. 17/151,194.

* cited by examiner

FOLDABLE DISPLAY DEVICE

CROSS REFERENCE TO RELATED APPLICATION

This application is a Continuation of U.S. patent application Ser. No. 17/151,194, filed on Jan. 17, 2021, which is a Continuation of U.S. patent application Ser. No. 16/353,336, filed on Mar. 14, 2019, now issued as U.S. Pat. No. 10,930,883, and claims from and the benefit of Korean Patent Application No. 10-2018-0048776, filed on Apr. 26, 2018, which is hereby incorporated by reference for all purposes as if fully set forth herein.

BACKGROUND

Field

Embodiments of the invention relate generally to a light-emitting display device, and, more specifically, to a foldable display device capable of being switched between a folded state and an unfolded state.

Discussion of the Background

Examples of a display device include an organic light-emitting diode (OLED) display device and a liquid crystal display (LCD) device.

Portable electronic devices usually include a display device to display images to a user. Portable electronic devices having a relatively small size, but having a relatively large display screen, have become popular, and the development of foldable or bendable display devices capable of being folded or unfolded to provide a large screen when in use is underway. Heretofore, folding of display devices has resulted in curved sections of the display that degrade display quality.

The above information disclosed in this Background section is only for understanding of the background of the inventive concepts, and, therefore, it may contain information that does not constitute prior art.

SUMMARY

Display devices constructed according to the principles and illustrative implementations of the invention provide a foldable display device capable of reducing or preventing the degradation of display quality.

For example, the foldable display device may include a display module and one or flexible films to position the neutral plane of the foldable display device at a particular location in the display module or in a layer of the display module, such as where driving transistors are formed, and/or may include one or more rigid films to maintain the display module in a relatively flat configuration even when an external force is applied.

Additional features of the inventive concepts will be set forth in the description which follows, and in part will be apparent from the description, or may be learned by practice of the inventive concepts.

According to an embodiment of the invention, a foldable display device assembly may comprise a rigid film, a first double-sided adhesive film, a lower flexible module, a second double-sided adhesive film, a flexible display module, a third double-sided adhesive film, and an upper flexible. The rigid film may have first and second sections between which a spacer having a first width is located. As one example, a portion of the first section and a portion of the second section may be connected to each other and the space may be located between the remaining portion of the first section and the remaining portion of the second section. As another example, the first and second sections may be separated from each other. The rigid film may be foldable about a folding axis disposed between the first and second sections. The first double-sided adhesive film may be disposed on the rigid film. The lower flexible module may be disposed on the first double-sided adhesive film. The second double-sided adhesive film may be disposed on the lower flexible module. The flexible display module may be disposed on the second double-sided adhesive film. The flexible display module may have an electroluminescent unit. The third double-sided adhesive film may be disposed on the flexible display module. The upper flexible module may be disposed on the third double-sided adhesive film.

The first double-sided adhesive film may extend continuously between the first and second sections of the rigid film.

A neutral plane having a width substantially defined by the first width may be substantially symmetrical with respect to the folding axis when the foldable display device is folded or unfolded. The first double-sided adhesive film at least in part may locate the neutral plane within the flexible display module.

The lower flexible module may include an impact absorbing layer. An entire of an upper surface of the first double-sided adhesive film may be directly attached to the lower flexible module. A lower surface of the first double-sided adhesive film may be directly attached to the first and second sections of the rigid film.

The foldable display device assembly may further comprise a first housing coupled to the first section of the rigid film, a second housing coupled to the second section of the rigid film, and a hinge connected between the first and second housings to correspond to the folding axis.

The first double-sided adhesive film may comprise a third section and a fourth section. The third and fourth sections may be separated from each other by a second width that is relatively greater than the first width. The third and fourth sections of the first double-sided adhesive film may be disposed above the first and second sections of the rigid film, respectively. An inner side of the first section of the rigid film may be relatively closer to the folding axis than an inner side of the third section of the first double-sided adhesive film to the folding axis. An inner side of the second section of the rigid film may be relatively closer to the folding axis than an inner side of the fourth section of the first double-sided adhesive film to the folding axis.

A neutral plane having a width substantially defined by the second width may be substantially symmetrical with respect to the folding axis when the foldable display device is folded or unfolded. The neutral plane may be located within the flexible display module.

The foldable display device may further comprise a height compensation film being disposed between the third and fourth sections of the first double-sided adhesive film and having substantially the same height as the first double-sided adhesive film.

The height compensation film may comprise a double-sided common adhesive film extending continuously over the first and second sections of the rigid film.

A neutral plane having a width substantially defined by the first width may be substantially symmetrical with respect to the folding axis when the foldable display device is folded or unfolded. The height compensation film may, at least in part, locate the neutral plane within the flexible display module.

The height compensation film may comprise a common film extending continuously over the first and second sections of the rigid film and may have an adhesive top surface and a non-adhesive bottom surface.

A neutral plane having a width substantially defined by the second width may be substantially symmetrical with respect to the folding axis when the foldable display device is folded or unfolded. The height compensation film may, at least in part, locate the neutral plane within the flexible display module.

The bottom surface of the height compensation film may comprise an inorganic material.

The height compensation film may be a common film extending continuously over the first and second sections of the rigid film and may have a non-adhesive top surface and an adhesive bottom surface.

A neutral plane having a width substantially defined by the second width may be substantially symmetrical with respect to the folding axis when the foldable display device is folded or unfolded. The height compensation film may, at least in part, locate the neutral plane within the flexible display module.

The height compensation film may comprise a fifth section and a sixth section separated from each other by a third width that is relatively greater than the first width and relatively smaller than the second width. The fifth and sixth sections of the height compensation film may be disposed above the first and second sections of the rigid film, respectively. An inner side of the first section of the rigid film may be relatively closer to the folding axis than an inner side of the fifth section of the height compensation film to the folding axis. An inner side of the second section of the rigid film may be relatively closer to the folding axis than an inner side of the sixth section of the height compensation film to the folding axis. The height compensation film may comprise a double-sided adhesive film.

A neutral plane having a width substantially defined by the third width may be substantially symmetrical with respect to the folding axis when the foldable display device is folded or unfolded. The neutral plane may be located within the flexible display module.

The height compensation film may further comprise a fifth section and a sixth section separated from each other by a third width that is relatively greater than the first width and relatively smaller than the second width. The fifth and sixth sections of the height compensation film may be disposed above the first and second sections of the rigid film, respectively. An inner side of the first section of the rigid film may be relatively closer to the folding axis than an inner side of the fifth section of the height compensation film to the folding axis. An inner side of the second section of the rigid film may be relatively closer to the folding axis than an inner side of the sixth section of the height compensation film to the folding axis. The height compensation film may have an adhesive top surface and a non-adhesive bottom surface.

A neutral plane having a width substantially defined by the second width may be substantially symmetrical with respect to the folding axis when the foldable display device is folded or unfolded. The height compensation film may, at least in part, locate the neutral plane within the flexible display module.

The bottom surface of the height compensation film may comprise an inorganic material.

The height compensation film may further comprise a fifth section and a sixth section separated from each other by a third width that is relatively greater than the first width and relatively smaller than the second width. The fifth and sixth sections of the height compensation film may be disposed above the first and second sections of the rigid film, respectively. An inner side of the first section of the rigid film may be relatively closer to the folding axis than an inner side of the fifth section of the height compensation film to the folding axis. An inner side of the second section of the rigid film may be relatively closer to the folding axis than an inner side of the sixth section of the height compensation film to the folding axis. The height compensation film may have a non-adhesive top surface and an adhesive bottom surface.

A neutral plane having a width substantially defined by the second width may be substantially symmetrical with respect to the folding axis when the foldable display device is folded or unfolded. The neutral plane may be located within the flexible display module.

The lower flexible module may include an impact absorbing layer. The first section of the rigid film and the second section of the rigid film may be separated from each other by the space such that a distance between an inner side surface of the first section and an inner side surface of the second section may be the first width. The first section of the rigid film may have an upper surface having a first portion and a second portion. The first portion may be connected to the inner side surface of the first section. The second portion may be connected to the first portion. The second section of the rigid film may have an upper surface having a third portion and a fourth portion. The third portion may be connected to the inner side surface of the second section. The fourth portion may be connected to the third portion. The first double-sided adhesive film may not be fixed to the first and third portions. The first double-sided adhesive film may be fixed to the second and fourth portions.

The foldable display device assembly may further comprise a first housing coupled to the first section of the rigid film, a second housing coupled to the second section of the rigid film, and a hinge connected between the first and second housings to correspond to the folding axis.

According to an embodiment of the invention, a foldable display device assembly may comprise a rigid film, a first double-sided adhesive film, a lower flexible module, a second double-sided adhesive film, a flexible display module, a third double-sided adhesive film, and an upper flexible. The rigid film may comprise first and second sections. The rigid film may be foldable about a folding axis disposed between the first and second sections. The first double-sided adhesive film may be disposed on the rigid film. The lower flexible module may be disposed on the first double-sided adhesive film. The second double-sided adhesive film may be disposed on the lower flexible module. The flexible display module may be disposed on the second double-sided adhesive film. The flexible display module may have an electroluminescent unit. The third double-sided adhesive film may be disposed on the flexible display module. The upper flexible module may be disposed on the third double-sided adhesive film. The first and second sections may have a substantially constant thickness. The rigid film may further comprise a substantially reduced thickness section located between the first and second sections.

The substantially reduced thickness section may have a thickness substantially varied along a predetermined direction.

According to another embodiment of the invention, a foldable display device assembly includes: a first plate having a first section, a second section, and a connection section connected between the first section and the second section, the first plate being foldable about a folding axis disposed between the first and second sections, the first section and the second section being rigid or semi-rigid, the connection section having a foldability and a first width measured in a direction from the first section of the plate to the second section of the plate when the foldable display device assembly is unfolded; a second plate disposed on the first plate; a first double-sided adhesive film disposed on the second plate; a flexible display module disposed on the first double-sided adhesive film, the flexible display module having an electroluminescent unit; a second double-sided adhesive film disposed on the flexible display module; and an upper flexible module disposed on the second double-sided adhesive film, wherein the connection section of the first plate includes a recess having a thickness smaller than a thickness of the first section of the first plate and a thickness of the second section of the first plate, and the second plate has a substantially lower light transmittance than the upper flexible module.

The foldable display device assembly may further include a third double-sided adhesive film disposed between the first plate and the second plate, wherein the third double-sided adhesive film extends substantially continuously over the first section of the first plate and the second section of the first plate.

A neutral plane having a width substantially smaller than the first width may be substantially symmetrical with respect to the folding axis when the foldable display device assembly is folded or unfolded, and the third double-sided adhesive film at least in part may locate the neutral plane within a foldable region of the flexible display module.

The connection section of the first plate may have a portion having an average thickness decreasing in the direction in which the first width is measured.

The recess of the connection section of the first plate may be a downwardly opening recess.

The downwardly opening recess may have at least one of a rounded inner corner and/or a rounded outer corner.

The recess of the connection section of the first plate may be an upwardly opening recess.

The upwardly opening recess may have a rounded inner corner.

The recess of the connection section of the first plate may be an upwardly opening recess.

The upwardly opening recess may have a rounded inner corner.

The foldable display device may further include a third double-sided adhesive film disposed between the first plate and the second plate, wherein the third double-sided adhesive film may include third and fourth sections separated from each other, the third section of the third double-sided adhesive film may be disposed between the first section of the first plate and the second plate, and the fourth section of the third double-sided adhesive film may be disposed between the second section of the first plate and the second plate.

The foldable display device assembly may further include: a buffer film disposed on the first plate; and a third double-sided adhesive film disposed between the buffer film and the second plate, wherein the buffer film may prevent an adhesion between the third double-sided adhesive film and the first plate from decreasing due to a difference in a physical property between the first plate and the third double-sided adhesive film.

The buffer film may include a non-metallic inorganic material.

The non-metallic inorganic material may include silicon.

The first plate may include a metal, and the third double-sided adhesive film may include an organic material.

According to still another embodiment of the invention, a foldable display device assembly includes: a first plate having a first section, a second section, and a connection section connected between the first section and the second section, the first plate being foldable about a folding axis disposed between the first and second sections; a second plate disposed on the first plate; a first double-sided adhesive film disposed on the second plate; a flexible display module disposed on the first double-sided adhesive film, the flexible display module having an electroluminescent unit; a second double-sided adhesive film disposed on the flexible display module; and an upper flexible module disposed on the second double-sided adhesive film, wherein the connection section of the first plate includes a recess having a thickness smaller than a thickness of the first section of the first plate and a thickness of the second section of the first plate, and the second plate has a substantially lower light transmittance than the upper flexible module.

According to the aforementioned and other embodiments of the invention, since a rigid film is disposed below a low flexible module, non-folding regions can be maintained to be substantially flat. Accordingly, the deformation of a flexible display module and the degradation of display quality can be reduced or prevented.

In addition, since a single-sided adhesive film is disposed between the flexible display module and the rigid film, the deformation of the flexible display module during the fabrication or use of a foldable display device can be minimized.

According to an embodiment of the invention, a foldable display device assembly includes: a rigid film having first and second sections spaced apart from each other, the rigid film being foldable about a folding axis disposed between the first and second sections of the rigid film; an adhesion structure having first and second adhesion sections spaced apart from each other, the first and second adhesion sections being disposed on the first and second sections of the rigid film, respectively; a lower flexible module disposed on the adhesion structure; a flexible display module disposed on the lower flexible module; and an upper flexible module disposed on the flexible display module. At least a portion of a lower surface of the first adhesion section corresponds to a first lower adhesion region to which an upper surface of the first section of the rigid film is adhered, at least a portion of an upper surface of the first adhesion section corresponds to a first upper adhesion region to which a lower surface of the lower flexible module is adhered, and an area of the first lower adhesion region is substantially different from an area of the first upper adhesion region. At least a portion of a lower surface of the second adhesion section corresponds to a second lower adhesion region to which an upper surface of the second section of the rigid film is adhered, at least a portion of an upper surface of the second adhesion section corresponds to a second upper adhesion region to which a lower surface of the lower flexible module is adhered, and an area of the second lower adhesion region is substantially different from an area of the second upper adhesion region.

The lower flexible module may continuously extend over the first and second sections of the rigid film.

A distance between the first and second lower adhesion regions may be substantially greater than a distance between the first and second sections of the rigid film.

The entire upper surface of the first adhesion section and the entire upper surface of the second adhesion section may be adhered to the lower surface of the lower flexible module.

The distance between the first and second lower adhesion regions may be substantially greater than a distance between the first and second upper adhesion regions.

A distance between the first and second upper adhesion regions may be substantially greater than a distance between the first and second sections of the rigid film.

The entire lower surface of the first adhesion section and the entire lower surface of the second adhesion section may be adhered to the upper surface of the first section of the rigid film and the upper surface of the second section of the rigid film, respectively.

A distance between the first and second lower adhesion regions may be substantially greater than a distance between the first and second sections of the rigid film.

The lower flexible module may have a substantially lower light transmittance than the upper flexible module.

According to an embodiment of the invention, a foldable display device assembly includes: a plate having a first section, a second section, and a connection section connected between the first and second sections, the plate being foldable about a folding axis disposed between the first and second sections, the first and second sections being rigid or semi-rigid, the connection section having a foldability and a first width measured in a direction from the first section of the plate to the second section of the plate when the foldable display device assembly is unfolded; a lower flexible module disposed on the plate; a first double-sided adhesive film disposed on the lower flexible module; a flexible display module disposed on the first double-sided adhesive film, the flexible display module having an electroluminescent unit; a second double-sided adhesive film disposed on the flexible display module; and an upper flexible module disposed on the second double-sided adhesive film. The connection section of the plate has an average thickness substantially smaller than the first and second sections of the plate, and the lower flexible module has a substantially lower light transmittance than the upper flexible module.

The foldable display device may further include a third double-sided adhesive film disposed between the plate and the lower flexible module. The third double-sided adhesive film may extend continuously over the first and second sections of the plate.

A neutral plane having a width substantially smaller than the first width may be substantially symmetrical with respect to the folding axis when the foldable display device assembly is folded or unfolded, and the third double-sided adhesive film may at least in part locate the neutral plane within a foldable region of the flexible display module.

The connection section of the plate may have a portion having an average thickness decreasing in the direction in which the first width is measured.

The connection section of the plate may have a downwardly opening recess.

The downwardly opening recess may have at least one of a rounded inner corner and/or a rounded outer corner.

The connection section of the plate may have an upwardly opening recess.

The upwardly opening recess may have a rounded inner corner.

The connection section of the plate may have an upwardly opening recess.

The upwardly opening recess may have a rounded inner corner.

The connection section of the plate may have a plurality of holes.

The foldable display device assembly may further include a third double-sided adhesive film disposed between the plate and the lower flexible module. The third double-sided adhesive film may include third and fourth sections separated from each other, the third section of the third double-sided adhesive film may be disposed between the first section of the plate and the lower flexible module, and the fourth section of the third double-sided adhesive film may be disposed between the second section of the plate and the lower flexible module.

The foldable display device assembly may further include: a buffer film disposed on the plate; and a third double-sided adhesive film disposed between the buffer film and the lower flexible module. The buffer film may prevent an adhesion between the third double-sided adhesive film and the plate from decreasing due to a difference in a physical property between the plate and the third double-sided adhesive film.

The buffer film may include a non-metallic inorganic material.

The non-metallic inorganic material may include silicon.

The plate may include a metal, and the third double-sided adhesive film may include an organic material.

According to an embodiment of the invention, a foldable display device assembly includes: a rigid film having first and second sections between which a space having a width measured in a direction from the first section of the rigid film to the second section of the rigid film when the foldable display device assembly is unfolded is disposed, the rigid film being foldable about a folding axis disposed between the first and second sections; a buffer film disposed on the rigid film; a first double-sided adhesive film disposed on the buffer film; a lower flexible module disposed on the first double-sided adhesive film; a second double-sided adhesive film disposed on the lower flexible module; a flexible display module disposed on the second double-sided adhesive film, the flexible display module having an electroluminescent unit; a third double-sided adhesive film disposed on the flexible display module; and an upper flexible module disposed on the third double-sided adhesive film. The lower flexible module has a substantially lower light transmittance than the upper flexible module, and the buffer film prevents an adhesion between the rigid film and the first double-sided adhesive film from decreasing due to a difference in a physical property between the rigid film and the first double-sided adhesive film.

The buffer film may include a non-metallic inorganic material.

The non-metallic inorganic material may include silicon.

The plate may include a metal, and the first double-sided adhesive film may include an organic material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
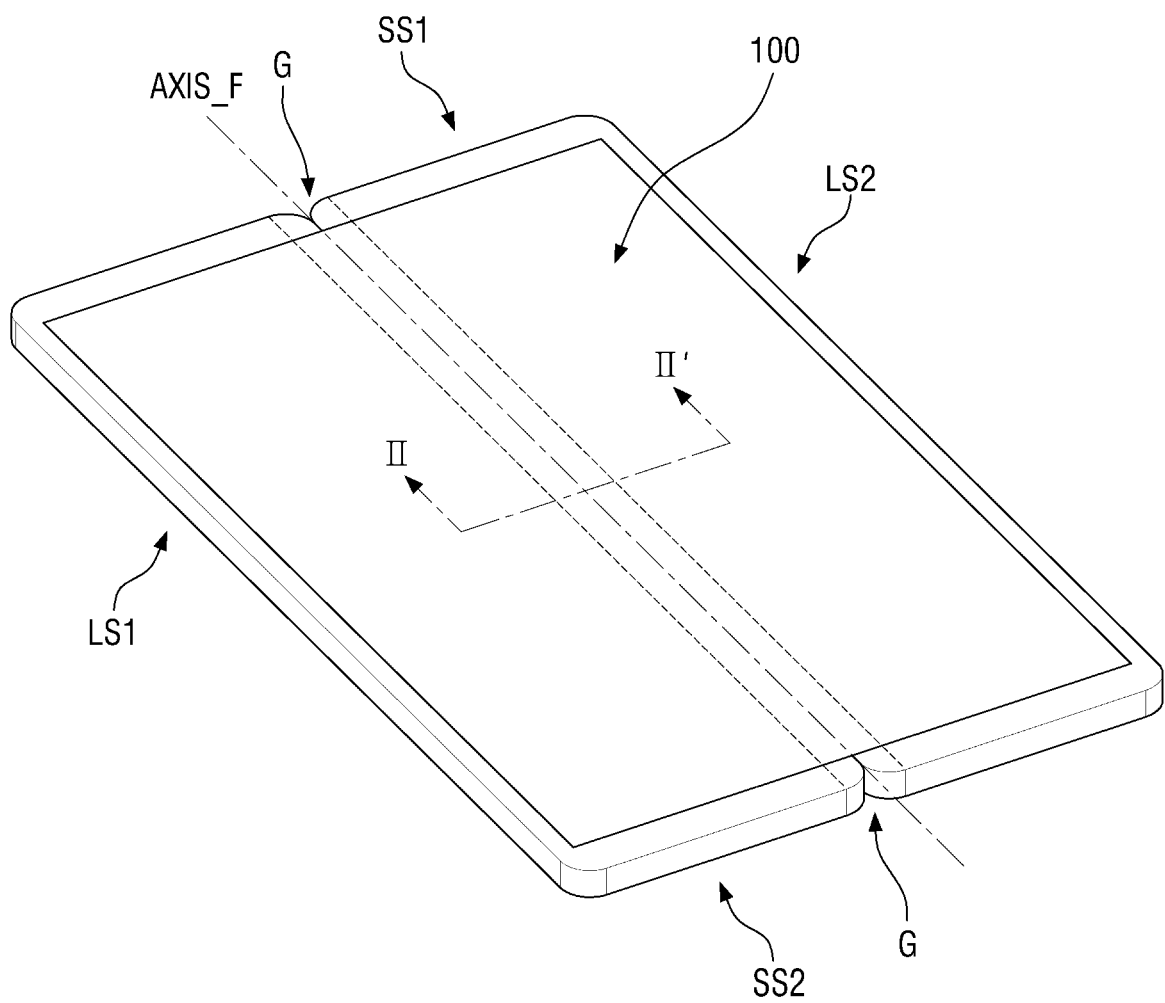
FIG. 1 is a perspective view of a foldable terminal equipped with a foldable display device according to an embodiment of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z," "at least one selected from the group of X, Y, and Z," and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
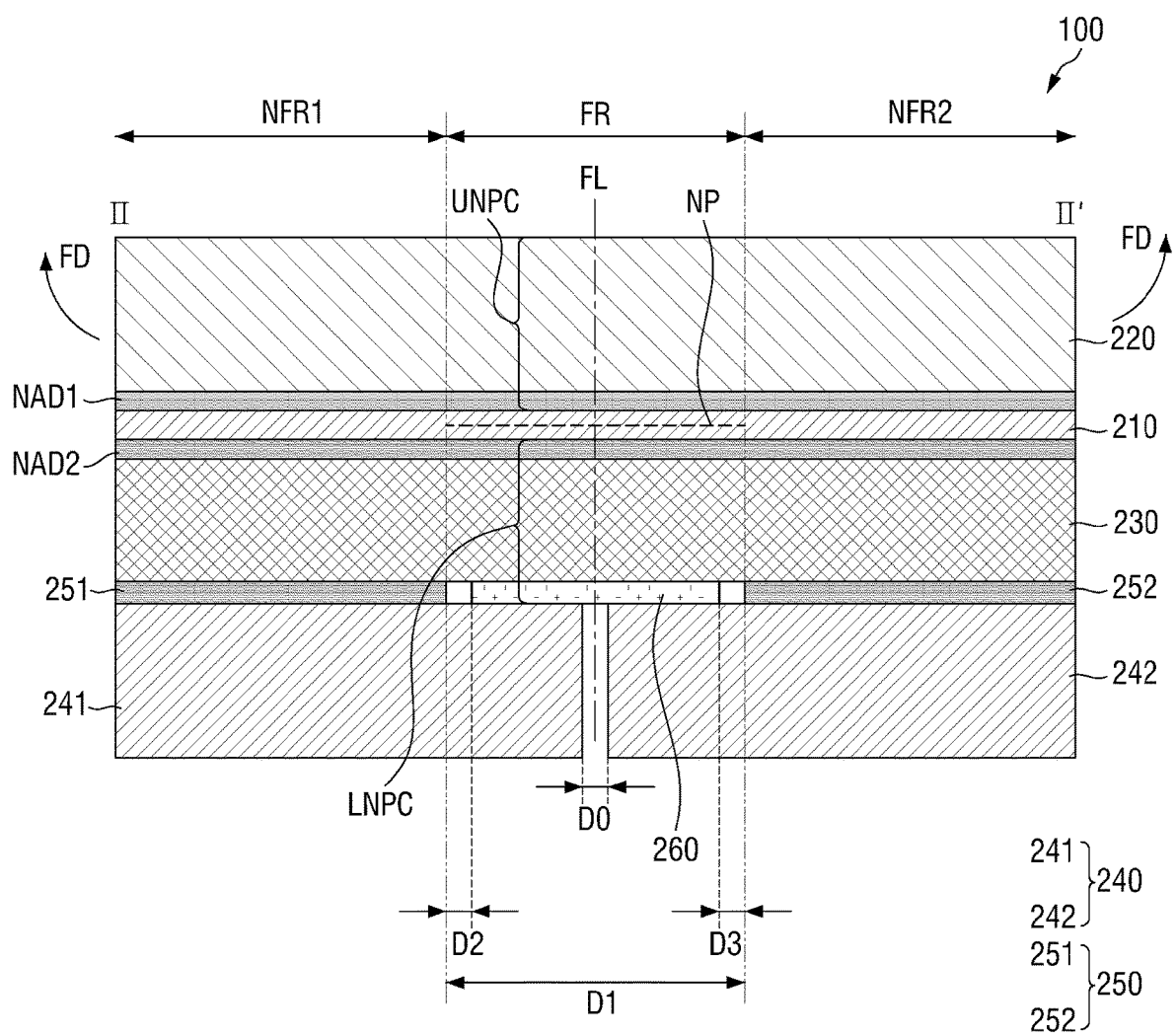
FIG. 2 is a cross-sectional view, taken along line II-II' of FIG. 1, of the foldable display device of FIG. 1.
Figure 3:
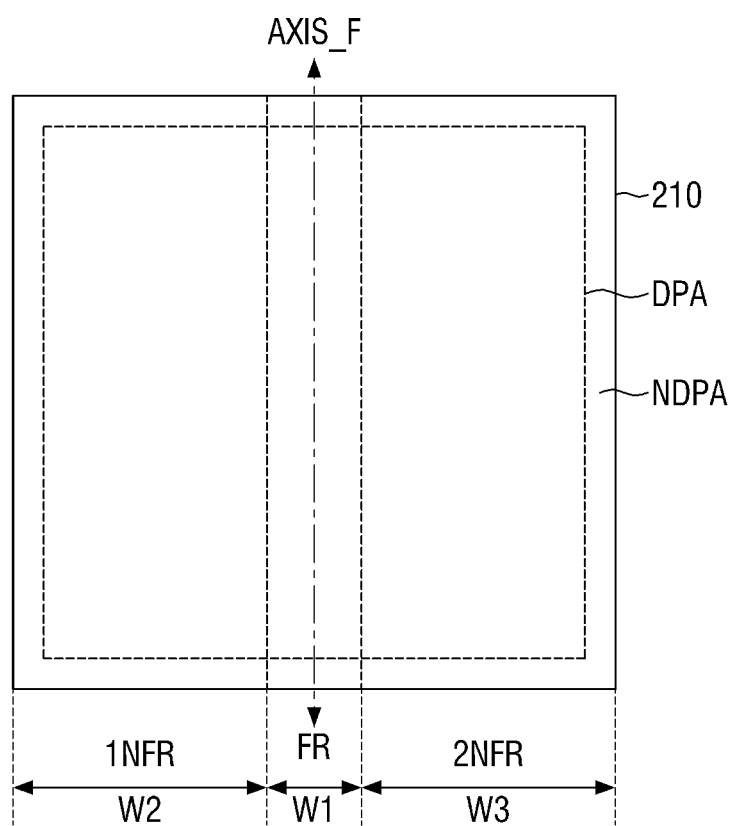
FIG. 3 is a plan view of the foldable display device of FIG. 1.

FIG. 1 is a perspective view of a foldable terminal equipped with a foldable display device according to an embodiment of the invention. FIG. 2 is a cross-sectional view, taken along line II-II' of FIG. 1, of the foldable display device of FIG. 1. FIG. 3 is a plan view of the foldable display device of FIG. 1.

As used herein, the term "foldable" encompasses partially foldable, foldable as a whole, rollable inwardly and/or outwardly and flexible, the term "module" refers to a structure including at least one film, and the term "display device" not only encompasses any type of information display device such as a television (TV), a terminal, mobile phone, personal digital assistant or the like, but also encompasses an optical device such as a light.

Referring to FIGS. 1 through 3, a foldable display device 100 may be formed as a substantial rectangle in a plan view. The foldable display device 100 may be formed as a substantial rectangle with right-angled corners or with rounded corners in a plan view. The foldable display device 100 may include four sides or edges. The foldable display device 100 may include long sides LS1 and LS2 and short sides SS1 and SS2.

Unless specified otherwise, the terms "top" and "above", as used herein, may refer to a display surface's side when a display module is in its unfolded state, and the terms "bottom" and "below", as used herein, may refer to the opposite side to the display surface's side when the display module is in its unfolded state. Also, in a plan view, the terms "on" or "above", "below" or "beneath", "left", and "right", as used herein, refer to directions when the display surface is viewed from above.

In a plan view, in the foldable display device 100, which is substantially rectangular in shape, or a display module 210 included in the foldable display device 100, the long side on the left will hereinafter be referred to as a first long side LS1, the long side on the right will hereinafter be referred to as a second long side LS2, the short side at the top will hereinafter be referred to as a first short side SS1, and the short side at the bottom will hereinafter be referred to as a second short side SS2. The length of the first and second long sides LS1 and LS2 of the foldable display device 100 may be about 1.2 to about 2.5 times the length of the first and second short sides SS1 and SS2 of the foldable display device 100, but the invention is not limited thereto.

The foldable display device 100 may be bent in a folding direction FD along a folding axis AXIS_F, which extends across the first and second short sides SS1 and SS2. That is, the foldable display device 100 may be switched between a folded (compact) state, which is a state in which the foldable display device 100 is folded in the folding direction FD along the folding axis AXIS_F, and an unfolded (expanded) state. Grooves (or notches) G, which are recessed toward the center of gravity in a plan view, may be formed at the first and second short sides SS1 and SS2 that meet the folding axis AXIS_F, and hinge members may be coupled to the grooves G. However, the invention is not limited to this. The switching of the foldable display device 100 between the folded state and the unfolded state will be described later after describing the elements of the foldable display device 100.

The foldable display device 100 may include the display module 210, which is also referred to as a flexible display module, a display panel, or a flexible display panel, an upper flexible module 220, a lower flexible module 230, and a rigid film 240. The foldable display device 100 may further include double-sided adhesive films (NAD1, NAD2, and 250) disposed (or interposed) between the display module 210, the upper flexible module 220, the lower flexible module 230, and the rigid film 240.

Examples of the double-sided adhesive films (NAD1, NAD2, and 250) include optical clear adhesives (OCAs), pressure sensitive adhesives (PSAs), and the like.

The display module 210 may display an image based on an input data signal. An organic light-emitting diode (OLED) display module, a liquid crystal display (LCD) module, a plasma display panel (PDP) module, an electrophoretic display (EPD) module, an electro-wetting display module, a quantum dot light-emitting display (QLED) module, a micro light-emitting diode (micro-LED) module or other type of display may be used as the display module 210. In the embodiment of FIGS. 1 through 3, an OLED display module is used as the display module 210 for ease of description.

The display module 210 may include a flexible substrate comprising a flexible polymer material such as polyimide. Accordingly, the display module 210 can be bent, folded, or rolled.

The display module 210 may generally have a substantially similar shape to the foldable display device 100 in a plan view, but the invention is not limited thereto. That is, alternatively, at least one side (e.g., the first long side LS1) of the display module 210 may be bent into a substantially curved shape, or may be bent in a vertical direction. A circuit board including wires transmitting signals necessary for driving the display module 210 may be connected via at least one side of the display module 210. The circuit board may be disposed to overlap with the display module 210 in a thickness direction.

The display module 210 may include a display area DPA, which displays an image, and a non-display area NDA, which does not display an image.

The display area DPA may be disposed at the center of the display module 210. The display area DPA may include pixels (or electroluminescent units). The pixels may include a light-emitting layer and a circuit layer controlling the amount of light emitted by the light-emitting layer. The circuit layer may include display wires, display electrodes, and at least one transistor. The light-emitting layer may comprise an organic light-emitting material. The light-emitting layer may be sealed by an encapsulation film. The encapsulation film seals the light-emitting layer and can thus prevent the penetration of external moisture or the like. The encapsulation film may include a single or multilayer inorganic film or a stack of at least one inorganic film and at least one organic film.

The display area DPA, like the foldable display device 100, may be in a generally rectangular shape with right-angled corners or with rounded corners, but the invention is not limited thereto. That is, alternatively, the display area DPA may be in various shapes other than a substantially rectangular shape, such as a substantially polygonal shape (e.g., a substantially square shape), a substantially circular shape, or a substantially elliptical shape.

The non-display area NDA may be disposed in the periphery of the display area DPA. The entire display module 210 except for the display area DPA may account for the non-display area NDA. The non-display area NDA may range from the outer boundaries of the display area DPA to the edges of the display module 210. In the non-display area NDA, signal wires or driving circuits for applying signals to the display area DPA may be disposed. Also, in the non-display area NDA, an outermost black matrix may be disposed.

The display module 210 may include a folding region FR (or a bendable region). The folding region FR will be described later together with the rigid film 240.

The upper flexible module 220 may be disposed above the display module 210 to overlap with the display module 210 in the thickness direction. The upper flexible module 220 and the lower flexible module 230 may be used to control the vertical position of a neutral plane NP of the foldable display device 100. When the foldable display device 100 is bent or folded, tensile stress may be generated on one side of the foldable display device 100, compressive stress may be generated on the opposite side of the foldable display device 100, and in the middle, there exists a plane where no stress exists. The plane where substantially no stress exists is defined as the neutral plane NP. Bending stress is not generated on the neutral plane NP. For example, the upper flexible module 220 (or an upper neutral plane controller UNPC) and the lower flexible module 230 (or a lower neutral plane controller LNPC) substantially position the neutral plane NP of the foldable display device 100 in the display module 210 (or in a layer of the display module 210 where driving transistors are formed).

The upper flexible module 220 may include one or more optical films and a window. The optical films may include a polarizing film, a micro-lens, a prism film, and the like. The optical films may have substantially the same shape as the display module 210 (or the display area DPA of the display module 210). The optical films may not be provided.

The window may be disposed above the optical films. The window covers and protects the display module 210. The window may be formed by using a transparent material. The window may comprise plastic, in which case, the window may have flexibility.

Examples of plastic that may be applicable to the window include, but are not limited to, polyimide, polyacrylate, polymethyl methacrylate (PMMA), polycarbonate (PC), polyethylene naphthalate (PEN), polyvinylidene chloride (PVDC), polyvinylidene difluoride (PVDF), polystyrene, an ethylene vinyl alcohol copolymer, polyethersulphone (PES), polyetherimide (PEI), polyphenylene sulfide (PPS), polyallylate, tri-acetyl cellulose (TAC), and cellulose acetate propionate (CAP), and the window may comprise at least one of these plastic materials.

An upper double-sided adhesive film NAD1 may be disposed between the upper flexible module 220 and the display module 210, and the upper flexible module 220 may be attached (or coupled) to the top surface of the display module 210 via the upper double-sided adhesive film NAD1. The upper double-sided adhesive film NAD1, which is a film having adhesiveness on both the top and bottom surfaces thereof, may be, for example, an optically clear adhesive (OCA).

The lower flexible module 230 may overlap with the display module 210 in the thickness direction and may be disposed below the display module 210.

The lower flexible module 230 may include one or more functional layers. The functional layer may be layers performing a heat dissipation function, an electromagnetic shielding function, a grounding function, a buffering function, a strength enhancement function, a support function, a bonding function, a pressure sensing function, and a digitizing function. The functional layers may be, for example, a supporting substrate, a heat dissipation layer, an electromagnetic wave shielding layer, an impact absorbing layer, a bonding layer, a pressure sensor, a digitizer, and the like.

The lower flexible module 230 may have relatively lower light transmittance than the upper flexible module 220. That is, the upper flexible module 220 may have a relatively high light transmittance and may transmit light (or an image) emitted from the display area DPA of the display module 210 upwardly, and the lower flexible module 230 may have a relatively low light transmittance and may block light which may be emitted downwardly from the display area DPA of the display module 210 and, then, may be reflected by the rigid film 240.

A lower double-sided adhesive film NAD2 may be disposed between the lower flexible module 230 and the display module 210, and the lower flexible module 230 may be attached (or coupled) to the bottom surface of the display module 210 via the lower double-sided adhesive film NAD2. The lower double-sided adhesive film NAD2, which is a film having adhesiveness on both the top and bottom surfaces thereof, like the upper double-sided adhesive film NAD1, may be, for example, a pressure sensitive adhesive (PSA).

The lower flexible module 230 may include an impact absorbing layer. The impact absorbing layer can prevent impact applied thereto from the outside (for example, from below the display module 210) from being transmitted to the display module 210. For example, the impact absorbing layer may comprise polyurethane (PU), thermoplastic polyurethane (TPU), silicon (Si), or polydimethyl acrylamide (PDMA).

The rigid film 240 may overlap with the lower flexible module 230 in the thickness direction and may be disposed below the lower flexible module 230.

The rigid film 240 may comprise a metal material such as steel special use stainless (SUS) or aluminum (Al) or a polymer such as PMAA, PC, polyvinyl alcohol (PVA), acrylonitrile-butadiene-styrene (ABS), or polyethylene terephthalate (PET). The rigid film 240 can prevent the bending of the display module 210 by an external force or can alleviate the degree to which the display module 210 is bent by an external force (e.g., the angle or the curvature radius to which the display module 210 is bent by an external force). That is, the rigid film 240 can maintain the display module 210 in a relatively flat configuration even when an external force is applied. The rigid film 240 may be rigid or semi-rigid. For example, the rigid film 240 may be a SUS film having a thickness of about 150 μm to about 200 μm. In another example, the rigid film 240 may be an Al film having a thickness of about 150 μm to about 200 μm.

Figure 5:
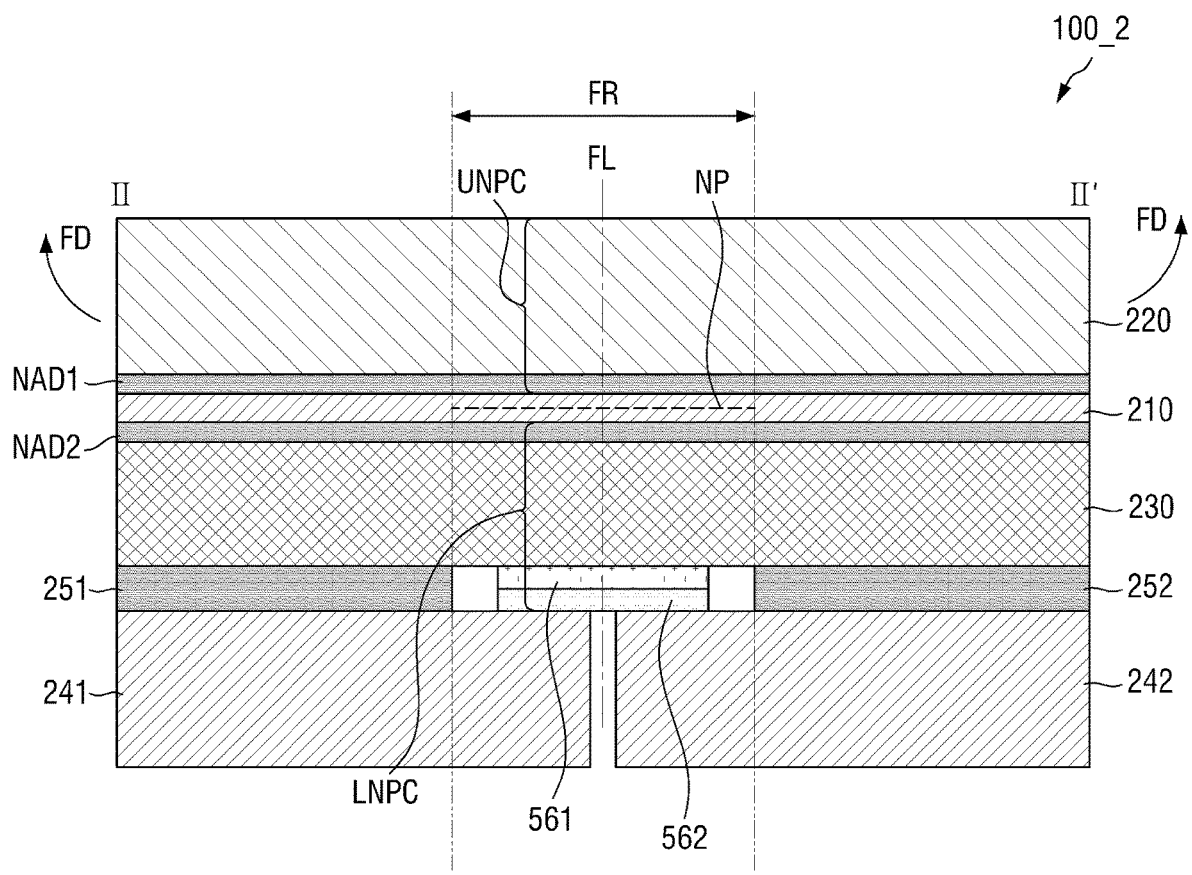

Referring to FIG. 5, a double-sided adhesive film 250 may be disposed between the rigid film 240 and the lower flexible module 230, and the rigid film 240 may be attached to the lower flexible module 230 via the double-sided adhesive film 250.

Protrusions or grooves (or holes) may be formed at the bottom of the rigid film 240, and a housing included in the foldable terminal may be coupled to the rigid film 240 (or the foldable display device 100) via the protrusions or the grooves.

Figure 6:
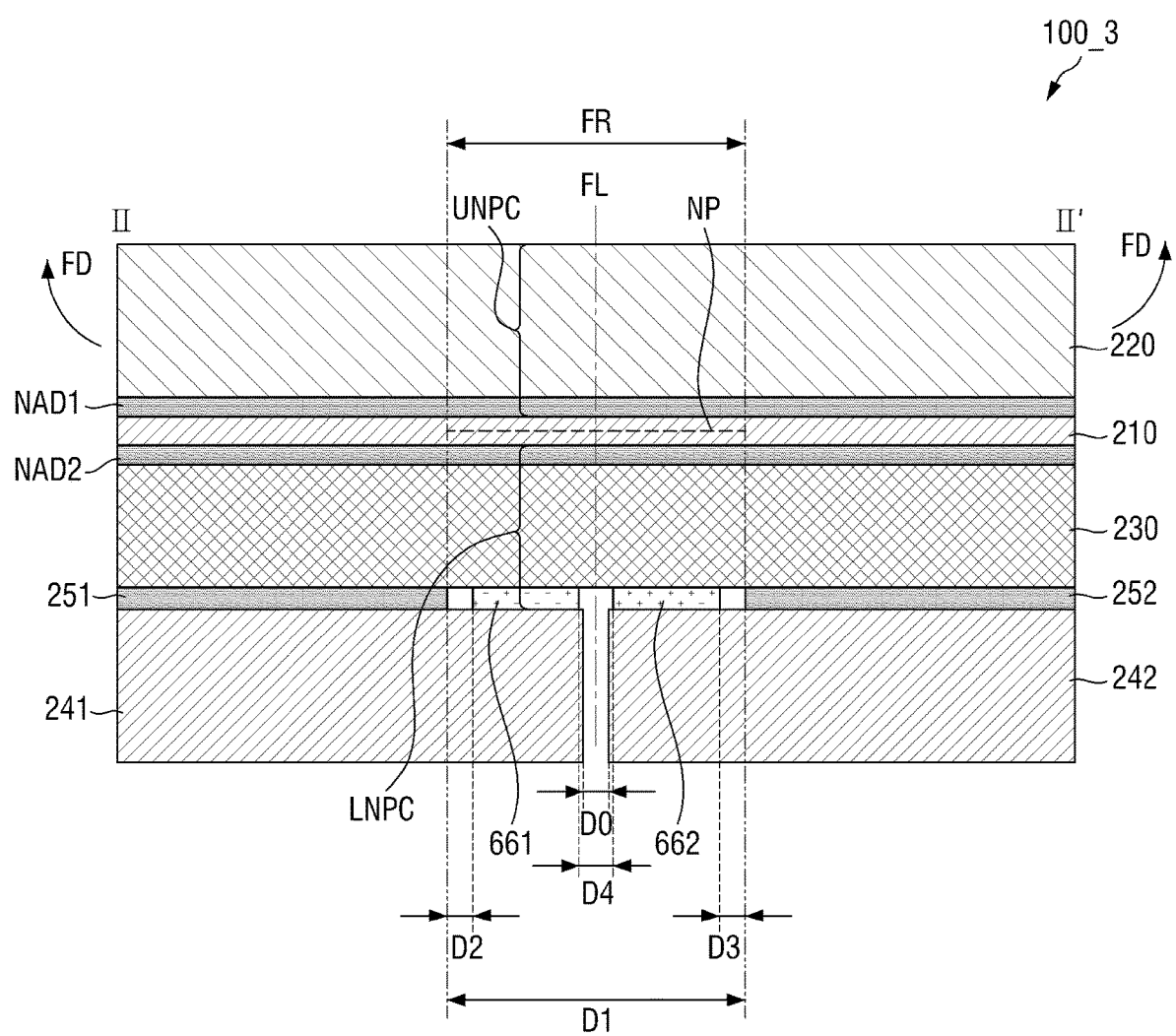

The rigid film 240 may include first and second plates (or first and second sections) 241 and 242, which are separate from each other in a left-to-right direction (or a horizontal direction). Referring to FIG. 6, the first and second plates 241 and 242 may be disposed on substantially the same plane and may be a reference distance D0 apart from each other in the left-to-right direction. For example, the reference distance D0 may be about 0.1 mm or less. The first and second plates 241 and 242 may be substantially symmetrical with respect to a folding line FL (i.e., a line that extends in the thickness direction to meet the folding axis AXIS_F), but the invention is not limited thereto. For example, the first and second plates 241 and 242 may be substantially asymmetrical with respect to the folding line FL.

The first and second plates 241 and 242 are illustrated in FIG. 2 as being separated from each other, but the invention is not limited thereto. That is, the example of FIG. 2 is simply for showing that the first and second plates 241 and 242 are separate (or discrete) from each other. In another example, the inner sides of the first and second plates 241 and 242 may be at least partially in contact with each other.

In one embodiment, the first and second plates 241 and 242 may have such a shape that their thickness decreases in a direction toward the folding line FL. For example, the thickness of the first and second plates 241 and 242 may decrease stepwise. In another example, the thickness of the first and second plates 241 and 242 may decrease continuously. In a case where the first and second plates 241 and 242 have such a shape that their thickness decreases in the direction toward the folding line FL, the flexibility of the first and second plates 241 and 242 may be relatively high near the folding line FL.

The double-sided adhesive film 250 may be disposed between the first and second plates 241 and 242 (or the rigid film 240) and the lower flexible module 230, and the first and second plates 241 and 242 may be coupled to the bottom of the lower flexible module 230 via the double-sided adhesive film 250.

The double-sided adhesive film 250 may include a first double-sided adhesive film (or a third section) 251 and a second double-sided adhesive film (or a fourth section) 252, which are separate from each other.

In a first non-folding region NFR1, the first double-sided adhesive film 251 may overlap with the display module 210 (or the lower flexible module 230) in the thickness direction and may be disposed between the lower flexible module 230 and the first plate 241. In this case, the first plate 241 may be coupled to the lower flexible module 230 via the first double-sided adhesive film 251. Similarly, in a second non-folding region NFR2, the second double-sided adhesive film 252 may overlap with the display module 210 (or the lower flexible module 230) in the thickness direction and may be disposed between the lower flexible module 230 and the second plate 242. In this case, the second plate 242 may be coupled to the lower flexible module 230 via the second double-sided adhesive film 252.

The first and second double-sided adhesive film 251 and 252 may be disposed on substantially the same plane and may be a first distance D1 apart from each other in the left-to-right direction. The first distance D1 may be relatively greater than the reference distance D0. The first and second double-sided adhesive films 251 and 252 may be bilaterally symmetrical with respect to the folding line FL.

The inner side of the first plate 241 may be relatively closer than the inner side of the second plate 242 to the folding line FL (or the folding axis AXIS_F), and the inner side of the second plate 242 may be relatively closer than the inner side of the second double-sided adhesive film 252 to the folding line FL.

In this case, the folding region FR and the first and second non-folding regions NFR1 and NFR2 of the display module 210 (or the foldable display device 100) may be substantially set or substantially defined by the first and second double-sided adhesive films 251 and 252. The first and second non-folding regions NFR1 and NFR2, which are regions where the first and second plates 241 and 242 are coupled to the lower flexible module 230 via the first and second double-sided adhesive films 251 and 252, may hardly be bent by an external force and may be generally flat. That is, the first and second non-folding regions NFR1 and NFR2 may be defined as regions where the rigid film 240 (or the first and second plates 241 and 242), the double-sided adhesive film 250 (or the first and second double-sided adhesive films 251 and 252), and the display module 210 overlap with one another and are coupled (or attached) to one another. The folding region FR may be a region that is not directly coupled to (or supported by) the first and second plates 241 and 242 and may be bent by an external force to a relatively greater extent than the first and second non-folding regions NFR1 and NFR2. For example, the degree to which the folding region FR is deformed by an external force (or the angle to which the folding region FR is bent by an external force) may be about three or more times the degree to which the first and second non-folding regions NFR1 and NFR2 are deformed by the external force (or the angle to which the first and second non-folding regions NFR1 and NFR2 are bent by the external force). The folding region FR may be switched from a folded state to an unfolded state or vice versa by an external force.

As illustrated in FIG. 3, the folding region FR may have a generally rectangular shape and may vertically extend from the first short side SS1 to the second short side SS2 to have a first width W1 with respect to the folding axis AXIS_F, which extends vertically. The first width W1 may be substantially the same as, or at least substantially similar to the first distance D1 between the first and second double-sided adhesive films 251 and 252 as shown in FIG. 6.

The first non-folding region NFR1 may have a second width W2 and may be connected to one side (e.g., the left side with respect to the folding axis AXIS_F) of the folding region FR. Similarly, the second non-folding region NFR2 may have a third width W3 and may be connected to the other side (e.g., the right side with respect to the folding axis AXIS_F) of the folding region FR. The second width W2 of the first non-folding region NFR1 may be substantially the same as, or substantially different from the third width W3 of the second non-folding region NFR2.

The foldable display device 100 may further include a single-sided adhesive film (or a height compensation film) 260.

The single-sided adhesive film 260 may overlap with the folding region FR of the display module 210 in the thickness direction and may be disposed between the lower flexible module 230 and the rigid film 240. That is, the single-sided adhesive film 260 may be disposed on substantially the same plane as the first and second double-sided adhesive films 251 and 252.

The single-sided adhesive film 260 may have substantially the same thickness as the double-sided adhesive film 250. The single-sided adhesive film 260 may be a second distance apart from the first double-sided adhesive film 251 and may be a third distance D3 apart from the second double-sided adhesive film 252. The third distance D3 may be substantially the same as, or substantially different from the second distance D2. For example, the second and third distances D2 and D3 may be about 0.1 mm or less or may be substantially zero.

The single-sided adhesive film 260 is a film having adhesiveness on at least one of the top and bottom surfaces thereof. For example, the single-sided adhesive film 260 may have adhesiveness on the top surface thereof, but no adhesiveness on the bottom surface thereof. That is, only the top surface of the single-sided adhesive film 260 may have adhesiveness. In this example, the single-sided adhesive film 260 may be attached to the bottom of the lower flexible module 230, but not to the rigid film 240 (or the first and second plates 241 and 242). In another example, the top and bottom surfaces of the single-sided adhesive film 260 may both have adhesiveness.

In a case where the single-sided adhesive film 260 has adhesiveness on the top surface thereof, but no adhesiveness on the bottom surface thereof, the position of the neutral plane NP may be substantially determined by the positions of the first and second double-sided adhesive films 251 and 252, and the width of the neutral plane NP may be substantially determined by the distance between the first and second double-sided adhesive films 251 and 252, i.e., the first distance D1. The width of the neutral plane NP may be substantially determined by the first distance D1, but is not necessarily the same as the first distance D1. For example, as the distance between the top surface of the rigid film 240 and the top surface of the upper flexible module 220 increases, the width of the neutral plane NP may become relatively smaller than the first distance D1. In another example, as the first distance D1 decreases, the width of the neutral plane NP may become relatively greater than the first distance D1.

In a case where the single-sided adhesive film 260 has adhesiveness on both the top and bottom surfaces thereof, the position of the neutral plane NP may be substantially determined by the positions of the first and second plates 241 and 242, and the width of the neutral plane NP may be substantially determined by the distance between the first and second plates 241 and 242, i.e., the reference distance D0. The width of the neutral plane NP may be substantially determined by the reference distance D0, but is not necessarily the same as the reference distance D0. For example, as the distance between the top surface of the rigid film 240 and the top surface of the upper flexible module 220 increases, the width of the neutral plane NP may become relatively smaller than the reference distance D0. In another example, as the reference distance D0 decreases, the width of the neutral plane NP may become relatively greater than the reference distance D0.

The single-sided adhesive film 260 may have substantially the same flexible characteristic as, or a substantially similar flexible characteristic to, the lower flexible module 230 (or the impact absorbing layer of the lower flexible module 230).

The rigid film 240 (or the first and second plates 241 and 242) may support the display module 210 (and the lower flexible module 230) via the single-sided adhesive film 260. Accordingly, deformation of the display module 210 during the fabrication and/or use of the foldable display device 100 can be reduced or prevented. For example, the display module 210 and the lower flexible module 230 can be prevented from being deformed in the folding region FR by a lamination roller during a lamination process for attaching the rigid film 240 to the lower flexible module 230.

As already mentioned above, since the rigid film 240 is disposed below the display module 210 (or the lower flexible module 230), the non-folding regions NFR1 and NFR2 can be maintained to be substantially flat. In addition, since the single-sided adhesive film 260 is disposed between the display module 210 and the rigid film 240, the deformation of the display module 210 during the fabrication or use of the foldable display device 100 can be reduced or prevented. As a result, the degradation of display quality can be reduced or prevented.

FIG. 2 illustrates the single-sided adhesive film 260 as having substantially the same thickness as each of the first and second double-sided adhesive films 251 and 252, but the invention is not limited thereto. For example, the thickness of the single-sided adhesive film 260 may be relatively smaller than the thickness of each of the first and second double-sided adhesive films 251 and 252. In another example, in a case where the single-sided adhesive film 260 includes substantially uneven patterns on the bottom surface thereof, the average thickness of the single-sided adhesive film 260 may be relatively smaller than the thickness of each of the first and second double-sided adhesive films 251 and 252.

FIGS. 4 through 7 are cross-sectional views of foldable display devices according to other embodiments of the invention.

Figure 4:
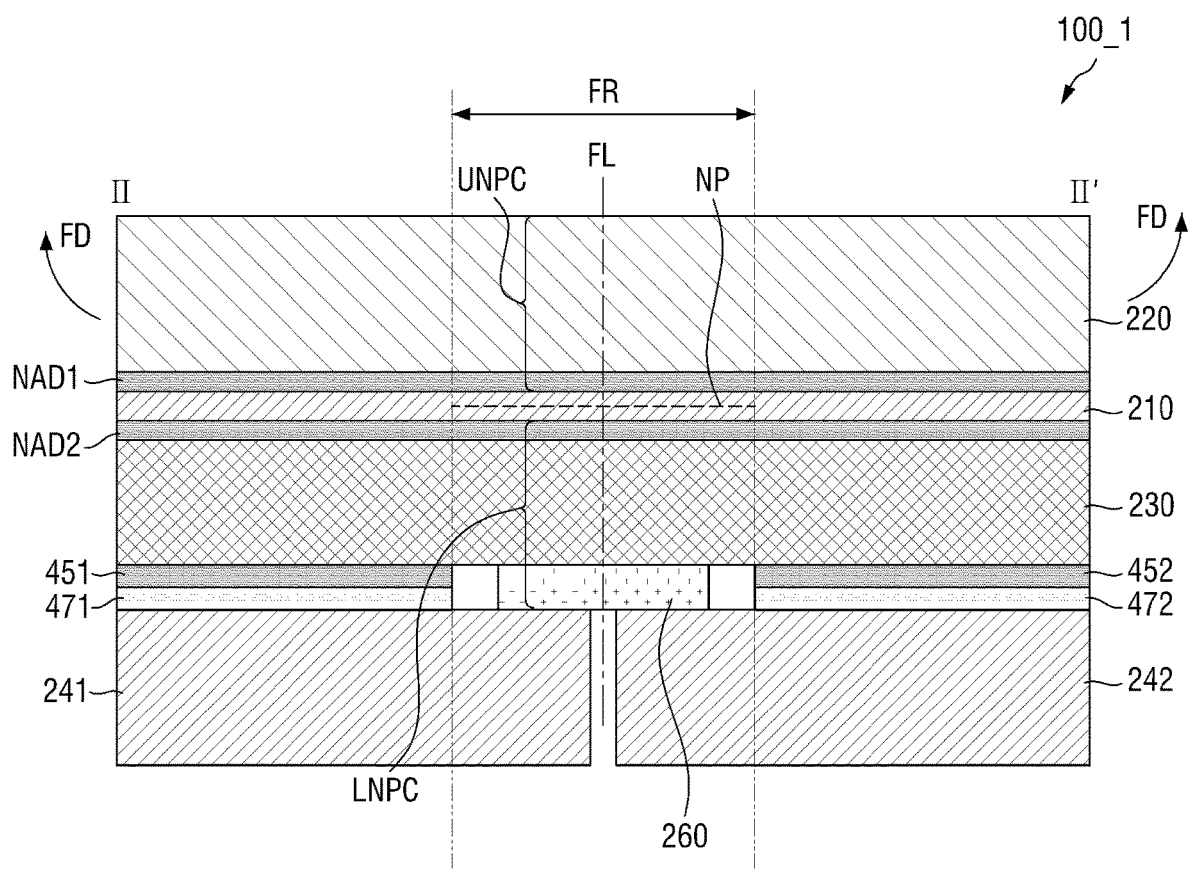
FIGS. 4, 5, 6, and 7 are cross-sectional views of foldable display devices according to other embodiments of the invention.

Referring to FIG. 4, a foldable display device 100_1 substantially differs from the foldable display device 100 of FIG. 2 in that it further includes first and second buffer films 471 and 472.

First and second double-sided adhesive films 451 and 452 may be substantially the same as the first and second double-sided adhesive films 251 and 252 of FIG. 2, and thus, detailed descriptions thereof will be omitted.

The first buffer film 471 may be disposed between the first double-sided adhesive film 451 and a first plate 241 in a thickness direction, and the second buffer film 472 may be disposed between the second double-sided adhesive film 452 and a second plate 242. The first buffer film 471 may have adhesiveness on the bottom surface thereof and may be attached to the first plate 241, and the second buffer film 472 may have adhesiveness on the bottom surface thereof and may be attached to the second plate 242.

The sum of the thicknesses of the first double-sided adhesive film 451 and the first buffer film 471 may be substantially the same as the thickness of a single-sided adhesive film 260. Similarly, the sum of the thicknesses of the second double-sided adhesive film 452 and the second buffer film 472 may be substantially the same as the thickness of the single-sided adhesive film 260.

The first and second buffer films 471 and 472 may comprise a non-metallic inorganic material such as silicon (Si) (or amorphous silicon). The first and second double-sided adhesive films 451 and 452 may comprise an organic material, and the first and second plates 241 and 242 may comprise a metal. In this case, the adhesion between the first and second double-sided adhesive films 451 and 452 and the first and second plates 241 and 242 can be prevented from decreasing due to the difference in a physical property such as a thermal expansion coefficient between the metal from the first and second plates 241 and 242 and the organic material from the first and second double-sided adhesive films 451 and 452.

Referring to FIG. 5, a foldable display device 100_2 substantially differs from the foldable display device 100 of FIG. 2 in that it includes a first film (or a first height compensation film) 561 and a second film (or a second height compensation film) 562.

In a folding region FR, the first film 561 may be disposed between a lower flexible module 230 and a rigid film 240, and the second film 562 may be disposed between the first film 561 and the rigid film 240. The first film 561 may be attached to the bottom of the lower flexible module 230, and the second film 562 may be attached to the bottom of the first film 561.

The sum of the thicknesses of the first and second films 561 and 562 may be substantially the same as the thickness of a double-sided adhesive film 250.

The first film 561 may have adhesiveness on the top surface thereof. At least one of the bottom surface of the first film 561 and the top surface of the second film 562 may have adhesiveness. The bottom surface of the second film 562 may not have adhesiveness. For example, the first film 561 may be a double-sided adhesive film or a single-sided adhesive film having adhesiveness on the top surface thereof.

The second film 562 may be an inorganic film comprising an inorganic material such as a metal. The adhesion of the second film 562 to the first and second plates 241 and 242 can be reduced when the second film 562 comprises a metal than when the second film 562 comprises an organic material.

The foldable display device 100_2 is illustrated in FIG. 5 as including first and second double-sided adhesive films 251 and 252, but the invention is not limited thereto. That is, alternatively, the foldable display device 100_2 may include the first and second double-sided adhesive films 451 and 452 and the first and second buffer films 471 and 472 of FIG. 4. In this case, the sum of the thicknesses of the first double-sided adhesive film 451 and the first buffer film 471 or the sum of the thicknesses of the second double-sided adhesive film 452 and the second buffer film 472 may be substantially the same as the sum of the thicknesses of the first and second films 561 and 562.

Referring to FIG. 6, a foldable display device 100_3 substantially differs from the foldable display device 100 of FIG. 2 in that it includes a first single-sided adhesive film (or a first height compensation film) 661 and a second single-sided adhesive film (or a second height compensation film) 662.

The first and second single-sided adhesive films 661 and 662 may overlap with each other in a folding region FR and may be disposed on substantially the same plane as first and second double-sided adhesive films 251 and 252.

The first single-sided adhesive film 661 may be disposed between a lower flexible module 230 and a first plate 241. Similarly, the second single-sided adhesive film 662 may be disposed between the lower flexible module 230 and a second plate 242. The first and second single-sided adhesive films 661 and 662 may be a fourth distance D4 apart from each other in a left-to-right direction. The fourth distance D4 may be substantially the same as, or relatively smaller than, a reference distance D0. For example, the inner side of the first single-sided adhesive film 661 (e.g., a side of the first single-sided adhesive film 661 adjacent to a folding line FL) may be disposed on substantially the same plane as the inner side of the first plate 241. In another example, the inner side of the first plate 241 may be relatively closer than the inner side of the first single-sided adhesive film 661 to the folding line FL.

The first single-sided adhesive film 661 may be a second distance D2 apart from the first double-sided adhesive film 251, and the second single-sided adhesive film 662 may be a third distance D3 apart from the second double-sided adhesive film 252. The second and third distances D2 and D3 may be substantially the same or may be substantially different. For example, the second and third distances D2 and D3 may be about 1 mm or less or may be substantially zero.

The first single-sided adhesive film 661 may have adhesiveness on the bottom surface thereof, but no adhesiveness on the top surface thereof. Similarly, the second single-sided adhesive film 662 may have adhesiveness on the bottom surface thereof, but no adhesiveness on the top surface thereof. In this case, the first single-sided adhesive film 661 may be attached to the top surface of the first plate 241, and the second single-sided adhesive film 662 may be attached to the top surface of the second plate 242.

Each of the first and second single-sided adhesive films 661 and 662 is a film having adhesiveness on at least one of the top and bottom surfaces thereof. For example, the first and second single-sided adhesive films 661 and 662 may have adhesiveness on the top surfaces thereof, but no adhesiveness on the bottom surfaces thereof. That is, the first and second single-sided adhesive films 661 and 662 may be adhesive films that have adhesiveness only on the bottom surfaces thereof. In this case, the first and second single-sided adhesive films 661 and 662 may be attached to the bottom of the lower flexible module 230, but not to the first and second plates 241 and 242.

In a case where the first and second single-sided adhesive films 661 and 662 have adhesiveness on the top surfaces thereof, but no adhesiveness on the bottom surface thereof, the position of a neutral plane NP may be substantially determined by the positions of the first and second double-sided adhesive films 251 and 252, and the width of the neutral plane NP may be substantially determined by the distance between the first and second double-sided adhesive films 251 and 252, i.e., a first distance D1. The width of the neutral plane NP may be substantially determined by the first distance D1, but is not necessarily the same as the first distance D1. For example, as the distance between the top surfaces of the first and second plates 241 and 242 and the top surface of an upper flexible module 220 increases, the width of the neutral plane NP may become relatively smaller than the first distance D1. In another example, as the first distance D1 decreases, the width of the neutral plane NP may become relatively greater than the first distance D1.

In a case where the first and second single-sided adhesive films 661 and 662 have adhesiveness on both the top surfaces and the bottom surfaces thereof, the position of the neutral plane NP may be substantially determined by the positions of the first and second single-sided adhesive films 661 and 662, and the width of the neutral plane NP may be substantially determined by the distance between the first and second single-sided adhesive films 661 and 662, i.e., the fourth distance D4. The width of the neutral plane NP may be substantially determined by the fourth distance D4, but is not necessarily the same as the fourth distance D4. For example, as the distance between the top surface of the first and second single-sided adhesive films 661 and 662 and the top surface of the upper flexible module 220 increases, the width of the neutral plane NP may become relatively smaller than the fourth distance D4. In another example, as the fourth distance D4 decreases, the width of the neutral plane NP may become relatively greater than the fourth distance D4.

The foldable display device 100_3 is illustrated in FIG. 6 as including the first and second double-sided adhesive films 251 and 252, but the invention is not limited thereto. That is, alternatively, the foldable display device 100_3 may include the first and second double-sided adhesive films 451 and 452 and the first and second buffer films 471 and 472 of FIG. 4. In this case, the sum of the thicknesses of the first double-sided adhesive film 451 and the first buffer film 471 or the sum of the thicknesses of the second double-sided adhesive film 452 and the second buffer film 472 may be substantially the same as the thickness of each of the first and second single-sided adhesive films 661 and 662.

Figure 7:
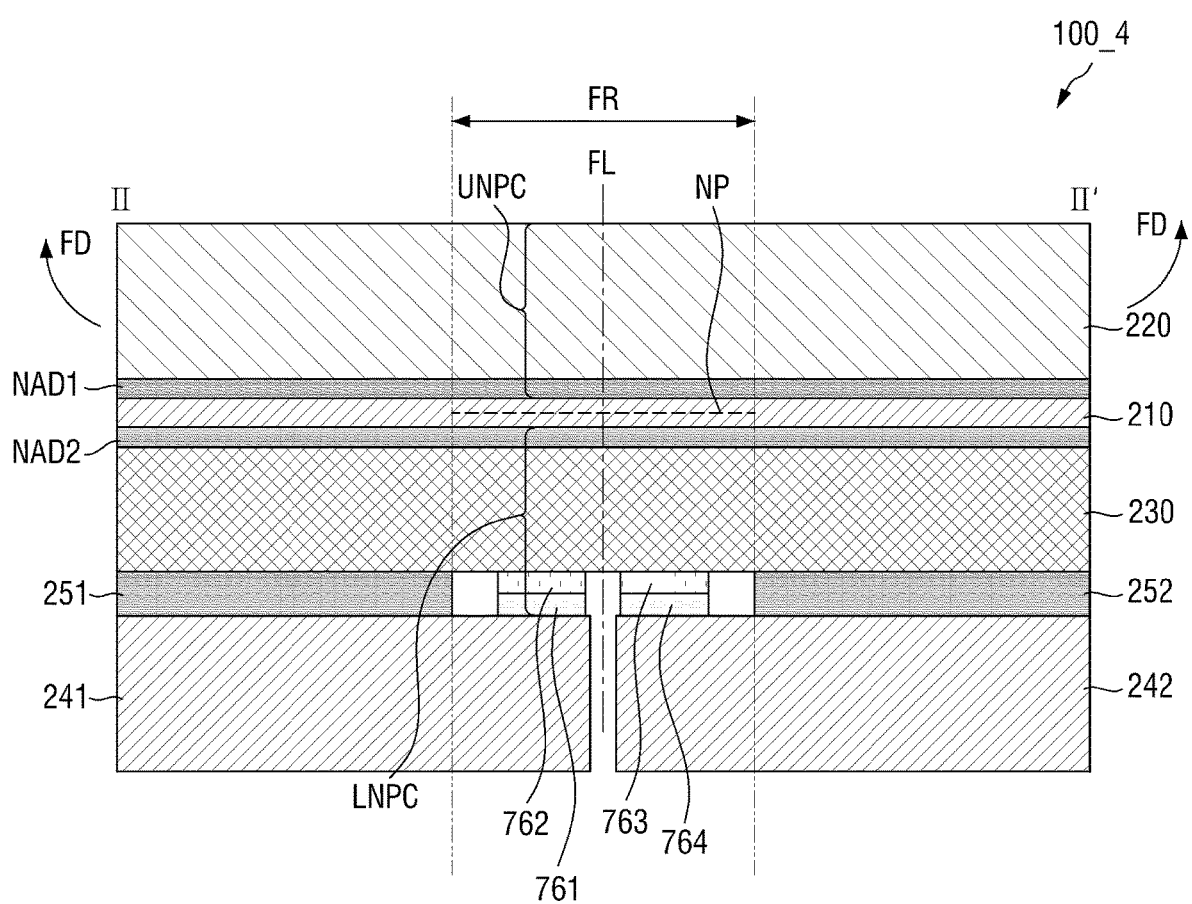

Referring to FIG. 7, a foldable display device 100_4 substantially differs from the foldable display device 100_3 of FIG. 6 (and the foldable display device 100_2 of FIG. 5) in that it includes first through fourth films (or first through fourth height compensation films) 761 through 764.

The first and third films 761 and 763 may be substantially the same as the first film 561 of FIG. 5 except for their locations. Similarly, the second and fourth films 762 and 764 may be substantially the same as the second film 562 of FIG. 5 except for their locations. Thus, detailed descriptions of the first through fourth films 761 and 764 will be omitted.

The foldable display device 100_4 is illustrated in FIG. 7 as including first and second double-sided adhesive films 251 and 252, but the invention is not limited thereto. That is, alternatively, the foldable display device 100_4 may include the first and second double-sided adhesive films 451 and 452 and the first and second buffer films 471 and 472 of FIG. 4. In this case, the sum of the thicknesses of the first double-sided adhesive film 451 and the first buffer film 471 or the sum of the thicknesses of the second double-sided adhesive film 452 and the second buffer film 472 may be substantially the same as the sum of the thicknesses of the first and second films 761 and 762 (or the sum of the thicknesses of the third and fourth films 763 and 764).

Figure 8:
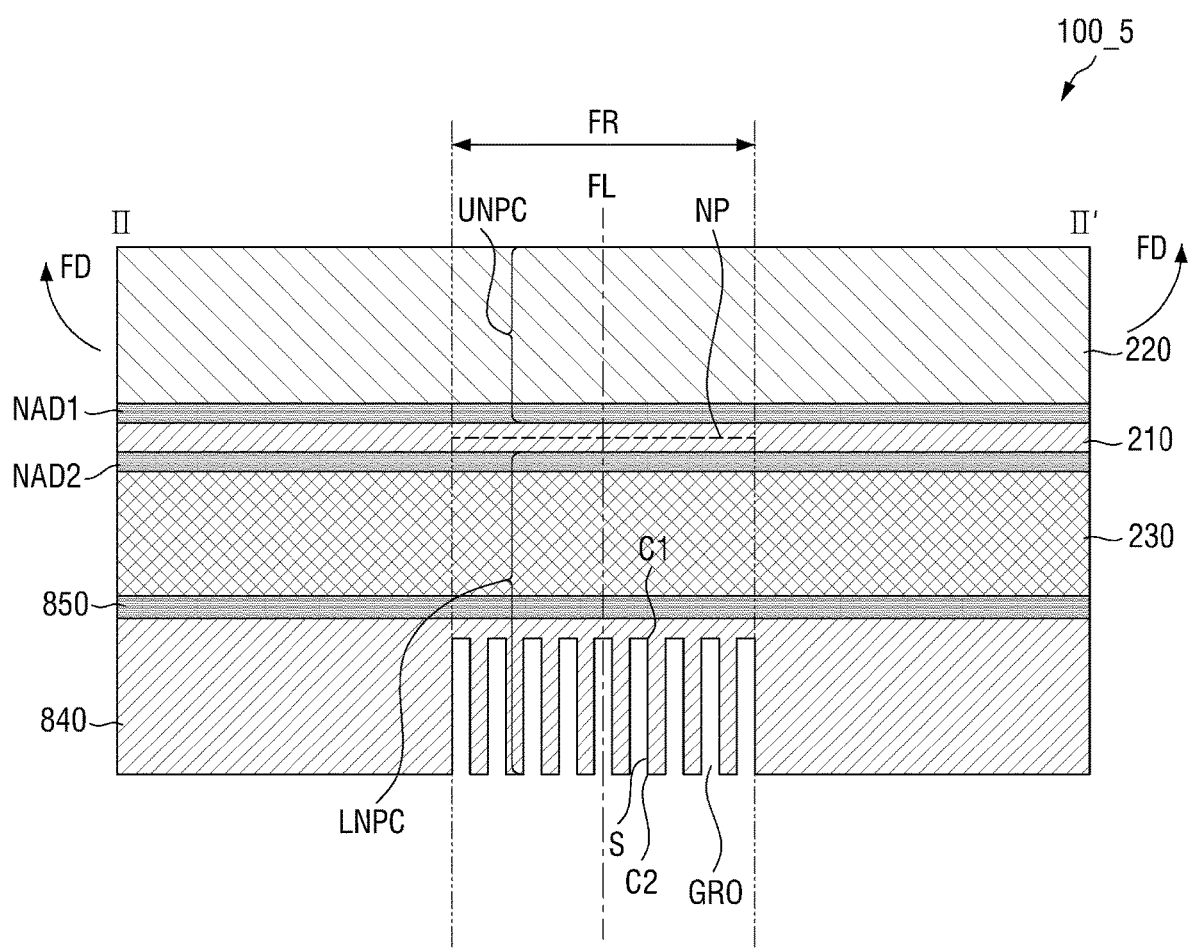
FIG. 8 is a cross-sectional view of a foldable display device according to another embodiment of the invention.

FIG. 8 is a cross-sectional view of a foldable display device according to another embodiment of the invention.

Referring to FIG. 8, a foldable display device 100_5 substantially differs from the foldable display device 100 of FIG. 2 in that it includes a plate 840 and a double-sided adhesive film 850.

The plate 840 and the double-sided adhesive film 850 may be substantially the same as, or substantially similar to, the rigid film 240 and the double-sided adhesive film 250, respectively, of FIG. 2, and thus, detailed descriptions thereof will be omitted.

The plate 840 may be disposed below a lower flexible module 230, and the double-sided adhesive film 850 may be interposed between the lower flexible module 230 and the plate 840. The plate 840 may be attached to the lower flexible module 230 via the double-sided adhesive film 850.

The average height (or average thickness) of the plate 840 in a folding region FR may be relatively smaller than the average height (or average thickness) of the plate 840 in a non-folding region. Similarly, the volume (or area) of the plate 840 in the folding region FR may be relatively smaller than the volume (or area) of the plate 840 in the non-folding region.

In the folding region FR, the plate 840 may include grooves (or recesses) formed on the bottom surface thereof. The grooves may be arranged in series in a left-to-right direction.

A folding line FL may pass through one of the grooves or between a pair of adjacent grooves.

First corners (or outer corners) C1 and second corners (or inner corners) C2 of each of the grooves of the plate 840 may be rounded, but the invention is not limited thereto.

Sidewalls S of each of the grooves (i.e., sidewalls between the first corners C1 and the second corners C2) may be sloped.

The density of the grooves or the width of the grooves increases relatively closer to the folding line FL, and the distance between the grooves decreases relatively closer to the folding line FL. Accordingly, the foldability (or the ease of folding) of the plate 840 can be improved. Similarly, the height (or average height) of the grooves decreases relatively closer to the folding line FL. Accordingly, the foldability of the plate 840 can also be improved.

Since the plate 840 is attached to the lower flexible module 230 via the double-sided adhesive film 850, the plate 840 may affect the control of the vertical position of a neutral plane NP of the foldable display device 100_6. The vertical position of the neutral plane NP can be controlled by adjusting the height of the grooves of the plate 840.

Although not specifically illustrated in FIG. 8, the foldable display device 100_5 may further include the buffer film 471 of FIG. 4. The buffer film 471 may be interposed between the double-sided adhesive film 850 and the plate 840.

Figure 9:
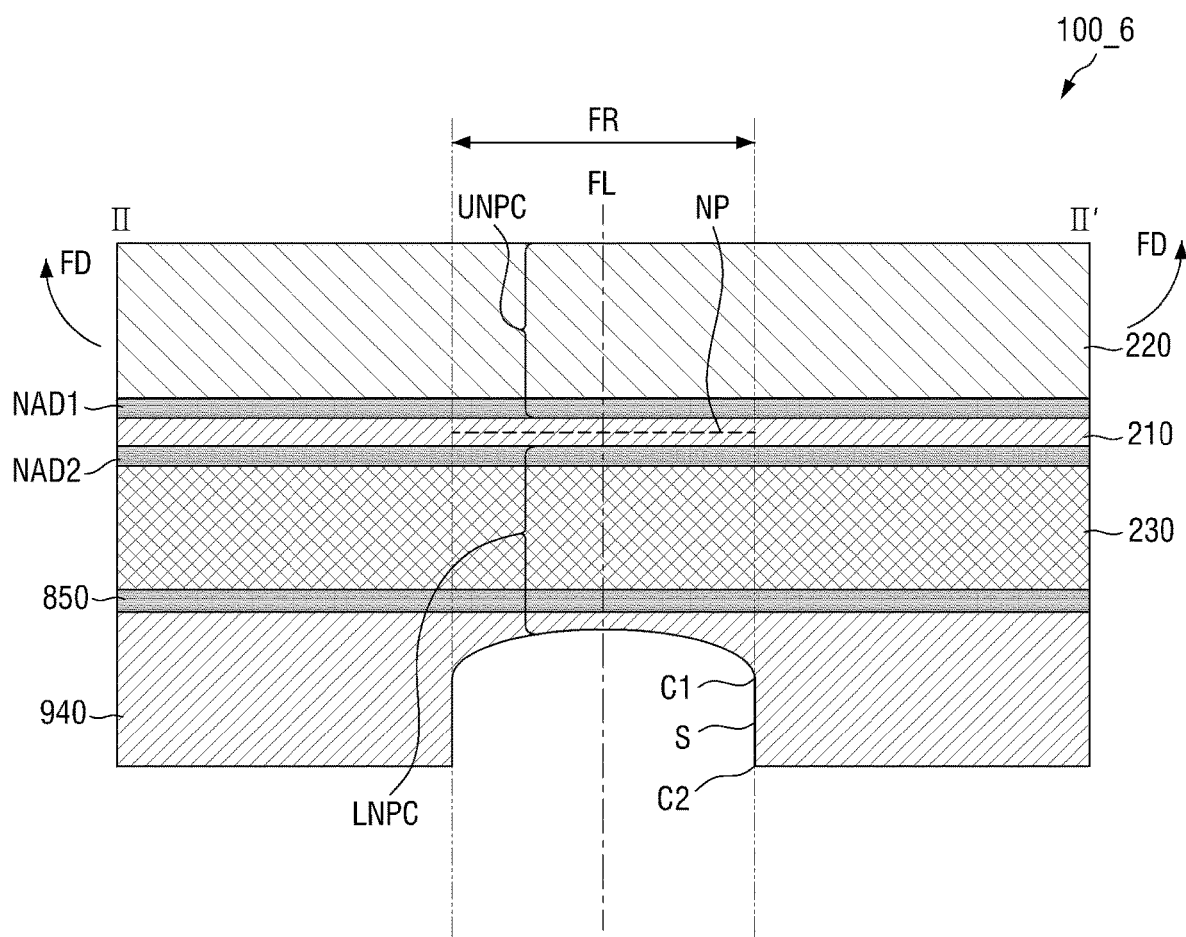
FIGS. 9, 10, and 11 are cross-sectional views of foldable display devices according to other embodiments of the invention.

FIG. 9 is a cross-sectional view of a foldable display device according to another embodiment of the invention.

Referring to FIG. 9, a foldable display device 100_6 substantially differs from the foldable display device 100_5 of FIG. 8 in that it includes a plate 940.

As described above with regard to the plate 840 of FIG. 8, the average height (or average thickness, volume, or area) of the plate 940 in a folding region FR may be relatively smaller than the average height (or average thickness, volume, or area) of the plate 940 in a non-folding region.

The plate 940 may include a groove formed on the bottom surface thereof to correspond to the whole folding region FR.

First corners C1 and second corners C2 of the groove of the plate 940 may be rounded. Sidewalls S of the groove (i.e., sidewalls between the first corners C1 and the second corners C2) may be sloped.

The thickness of the groove of the plate 940 decreases relatively closer to a folding line FL and increases relatively closer to the first corners C1. The groove of the plate 940 may be generally semicircular in shape.

The plate 940, like the plate 840 of FIG. 8, may affect the control of the vertical position of a neutral plane NP of the foldable display device 100_6.

Although not specifically illustrated in FIG. 9, the foldable display device 100_6 may further include the buffer film 471 of FIG. 4. The buffer film 471 may be interposed between a double-sided adhesive film 850 and the plate 940.

Figure 10:
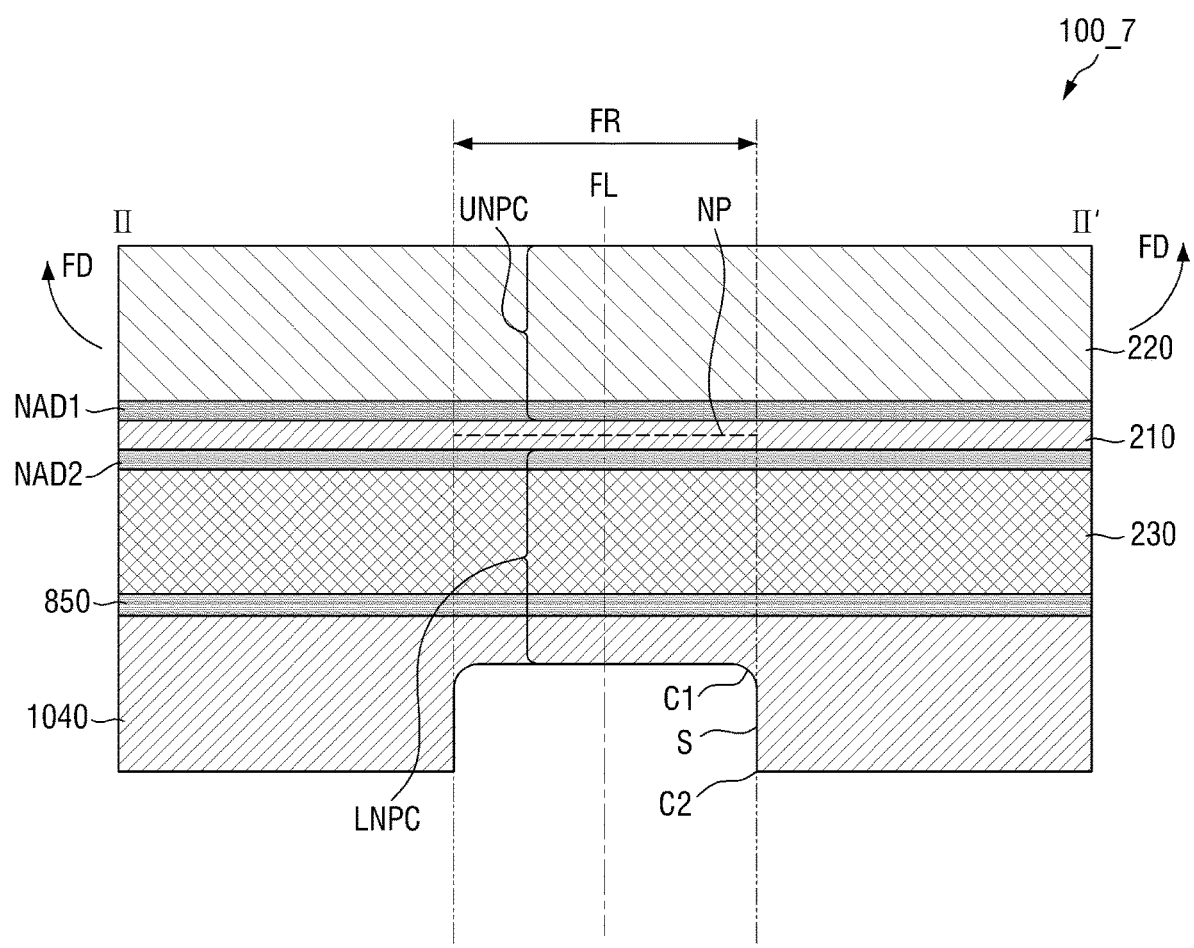

FIG. 10 is a cross-sectional view of a foldable display device according to another embodiment of the invention.

Referring to FIG. 10, a foldable display device 100_7 substantially differs from the foldable display device 100_6 of FIG. 9 in that it includes a plate 1040.

As described above with regard to the plate 940 of FIG. 9, the average height (or average thickness, volume, or area) of the plate 1040 in a folding region FR may be relatively smaller than the average height (or average thickness, volume, or area) of the plate 1040 in a non-folding region. The plate 1040 may include a groove formed on the bottom surface thereof to correspond to the whole folding region FR.

First corners C1 and second corners C2 of the groove of the plate 940 may be rounded. Sidewalls S of the groove (i.e., sidewalls between the first corners C1 and the second corners C2) may be sloped.

The thickness of the groove of the plate 1040 may be uniform from the first corners C1 to a folding line FL. That is, the inside of the groove of the plate 1040 may be generally flat.

The plate 1040, like the plate 840 of FIG. 8, may affect the control of the vertical position of a neutral plane NP of the foldable display device 100_7.

Although not specifically illustrated in FIG. 10, the foldable display device 100_7 may further include the buffer film 471 of FIG. 4. The buffer film 471 may be interposed between a double-sided adhesive film 850 and the plate 1040.

Figure 11:
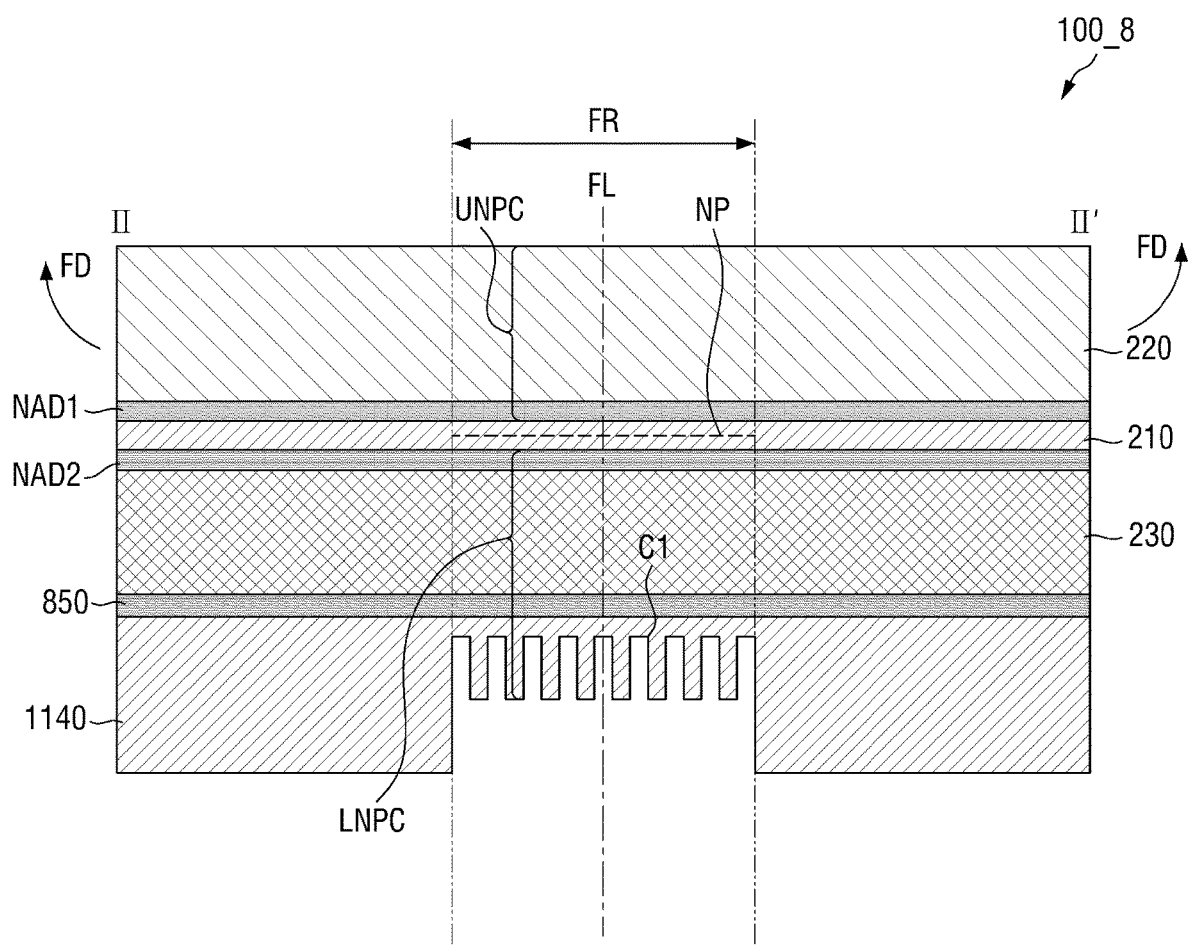

FIG. 11 is a cross-sectional view of a foldable display device according to another embodiment of the invention.

Referring to FIG. 11, a foldable display device 100_8 substantially differs from the foldable display device 100_7 of FIG. 10 (or the foldable display device 100_5 of FIG. 8) in that it includes a plate 1140.

As described above with regard to the plate 1040 of FIG. 10, the average height (or average thickness, volume, or area) of the plate 1140 in a folding region FR may be relatively smaller than the average height (or average thickness, volume, or area) of the plate 1040 in a non-folding region. The entire bottom of the plate 1140 may be upwardly recessed in the folding region FR.

In the folding region FR, the plate 1140, like the plate 840 of FIG. 8, may include grooves formed on the bottom surface thereof. The grooves may be arranged in a left-to-right direction.

By adjusting the density and width of, and the distance between, the grooves of the plate 1140, the foldability of the plate 1140 can be improved.

Although not specifically illustrated in FIG. 11, the foldable display device 100_8 may further include the buffer film 471 of FIG. 4. The buffer film 471 may be interposed between a double-sided adhesive film 850 and the plate 1140.

Figure 12:
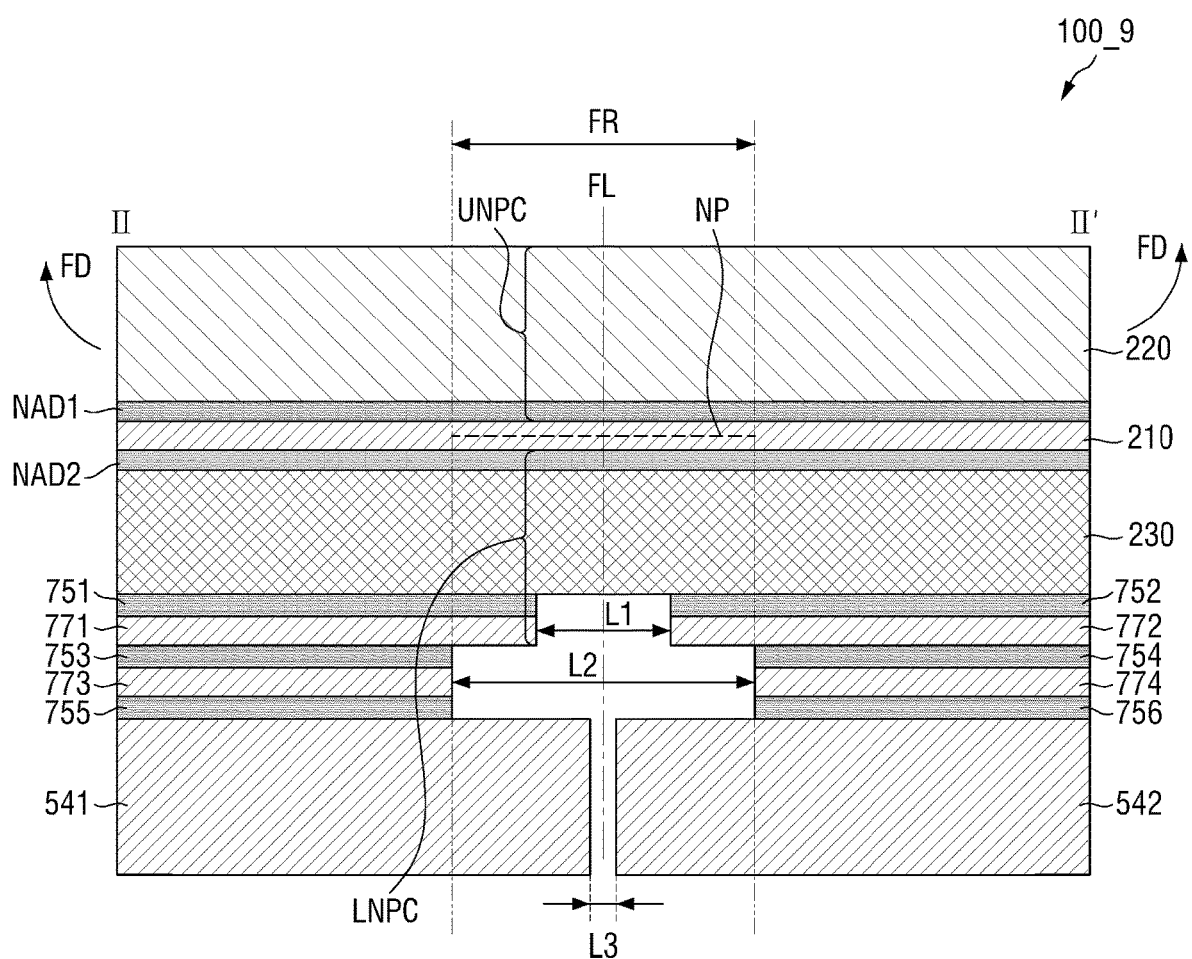
FIG. 12 is a cross-sectional view of a foldable display device according to yet another embodiment of the invention.

FIG. 12 is a cross-sectional view of a foldable display device according to another embodiment of the invention.

Referring to FIG. 12, a foldable display device 100_9 substantially differs from the foldable display device 100 of FIG. 2 in that it includes first through fourth intermediate films 771 through 774 and first through sixth double-sided adhesive films 751 through 756.

The first through fourth intermediate films 771 through 774 may have flexibility. The first through sixth double-sided adhesive films 751 through 756, like the first double-sided adhesive film 251 of FIG. 2, may have adhesives on both the top surfaces and the bottom surfaces thereof.

The first intermediate film 771 may be disposed between a first plate 241 and a lower flexible module 230. The third intermediate film 773 may be disposed between the first plate 241 and the first intermediate film 771. Similarly, the second intermediate film 772 may be disposed between a second plate 242 and the lower flexible module 230, and the fourth intermediate film 774 may be disposed between the second plate 242 and the second intermediate film 772.

The first double-sided adhesive film 751 may be disposed between the first intermediate film 771 and the lower flexible module 230. The first double-sided adhesive film 751 may have substantially the same size (or area) as the first intermediate film 771 and may completely overlap with the first intermediate film 771. The third double-sided adhesive film 753 may be disposed between the first and third intermediate films 771 and 773, and the fifth double-sided adhesive film 755 may be disposed between the third intermediate film 773 and the first plate 241. The third and fifth double-sided adhesive films 753 and 755 may have substantially the same size (or area) as the third intermediate film 773 and may completely overlap with the third intermediate film 773. Thus, the first plate 241 may be coupled to the lower flexible module 230 via the first and third intermediate films 771 and 773 and the first, third, and fifth double-sided adhesive films 751, 753, and 755.

Similarly, the second double-sided adhesive film 752 may be disposed between the second intermediate film 772 and the lower flexible module 230. The second double-sided adhesive film 752 may have substantially the same size (or area) as the second intermediate film 772 and may completely overlap with the second intermediate film 772. The fourth double-sided adhesive film 754 may be disposed between the second and fourth intermediate films 772 and 774, and the sixth double-sided adhesive film 756 may be disposed between the fourth intermediate film 774 and the second plate 242. The fourth and sixth double-sided adhesive films 754 and 756 may have substantially the same size (or area) as the fourth intermediate film 774 and may completely overlap with the fourth intermediate film 774. Thus, the second plate 242 may be coupled to the lower flexible module 230 via the second and fourth intermediate films 772 and 774 and the second, fourth, and sixth double-sided adhesive films 752, 754, and 756.

The second intermediate film 772 may be disposed on substantially the same plane as the first intermediate film 771 and may be a first distance L1 apart from the first intermediate film 771 in a left-to-right direction. The second intermediate film 772 may be substantially symmetrical with the first intermediate film 711 with respect to a folding line FL.

The fourth intermediate film 774 may be disposed on substantially the same plane as the third intermediate film 773 and may be a second distance L2 apart from the third intermediate film 773 in the left-to-right direction. The fourth intermediate film 774 may be substantially symmetrical with the third intermediate film 713 with respect to the folding line FL.

The distance between the third and fourth intermediate films 773 and 774, i.e., the second distance L2, may be relatively greater than the distance between the first and second intermediate films 771 and 772, i.e., the first distance L1. Also, the first distance L1 may be relatively greater than the distance between first and second plates 241 and 242, i.e., a third distance L3.

In this case, non-folding regions may be set as a region in which the rigid film 240, the first and third intermediate films 771 and 773, and the lower flexible module 230 all overlap with one another and a region in which the rigid film 240, the second and fourth intermediate films 772 and 774, and the lower flexible module 230 all overlap with one another. Accordingly, a folding region FR may be substantially defined by the third and fourth intermediate films 773 and 774, which are the most distant apart from each other and may be a region that does not overlap with the third and fourth intermediate films 773 and 774 in the thickness direction.

The first and third intermediate films 771 and 773 may overlap with the folding region FR, and the first intermediate film 771 (or the first double-sided adhesive film 751) and the third intermediate film 773 (or the second double-sided adhesive film 752) can contribute to the adjustment of the position of a neutral plane NP. Also, the first and third intermediate films 771 and 773 can prevent the flexibility of the foldable display device 100_9 from rapidly changing and can distribute stress caused by bending at the boundaries between the folding region FR and the non-folding regions.

Although not specifically illustrated in FIG. 12, the foldable display device 100_9 may include the first and second buffer films 471 and 472 of FIG. 4. The first buffer film 471 may be disposed between the fifth double-sided adhesive film 755 and the first plate 241, and the second buffer film 472 may be disposed between the sixth double-sided adhesive film 756 and the second plate 242.

Although not specifically illustrated in FIG. 12, the foldable display device 100_9 may further include the single-sided adhesive film 260 of FIG. 1 or the first and second films 561 and 562 of FIG. 5. The single-sided adhesive film 260 (or the first and second films 561 and 562) may be disposed between the lower flexible module 230 and the first plate 241, between the lower flexible module 230 and the second plate 242, between the first intermediate film 771 and the first plate 241, and/or between the second intermediate film 772 and the second plate 242.

FIGS. 13 through 23 are cross-sectional views of foldable display devices according to other embodiments of the invention.

Figure 13:
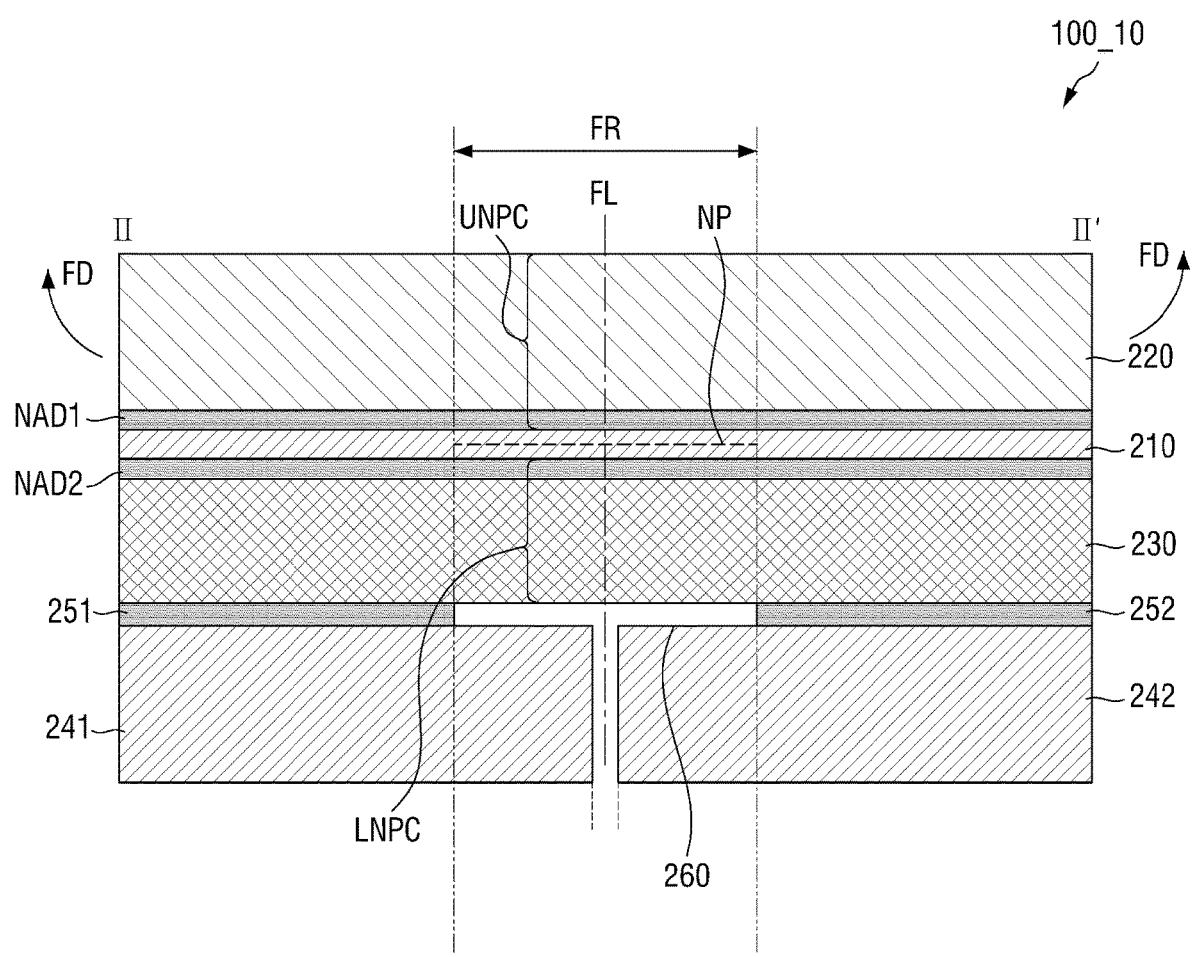
FIGS. 13, 14, 15, 16, 17, 18, 19, 20, 21, 22, and 23 are cross-sectional views of foldable display devices according to other embodiments of the invention.

Referring to FIG. 13, a foldable display device 100_10 substantially differs from the foldable display device 100 of FIG. 2 in that it does not include the single-sided adhesive film 260.

In the foldable display device 100 of FIG. 2, the lower double-sided adhesive film NAD2, the lower flexible module 230, and the single-sided adhesive film 260 are provided to form the lower neutral plane controller LNPC. On the other hand, in the foldable display device 100_10 of FIG. 13, only the lower double-sided adhesive film NAD2 and the lower flexible module 230 are provided to form the lower neutral plane controller LNPC.

Accordingly, non-folding regions may be substantially defined by first and second double-sided adhesive films 251 and 252, and in a folding region FR, a neutral plane NP can be partially aligned with (or, partially located or positioned within) a display module 210.

Figure 14:
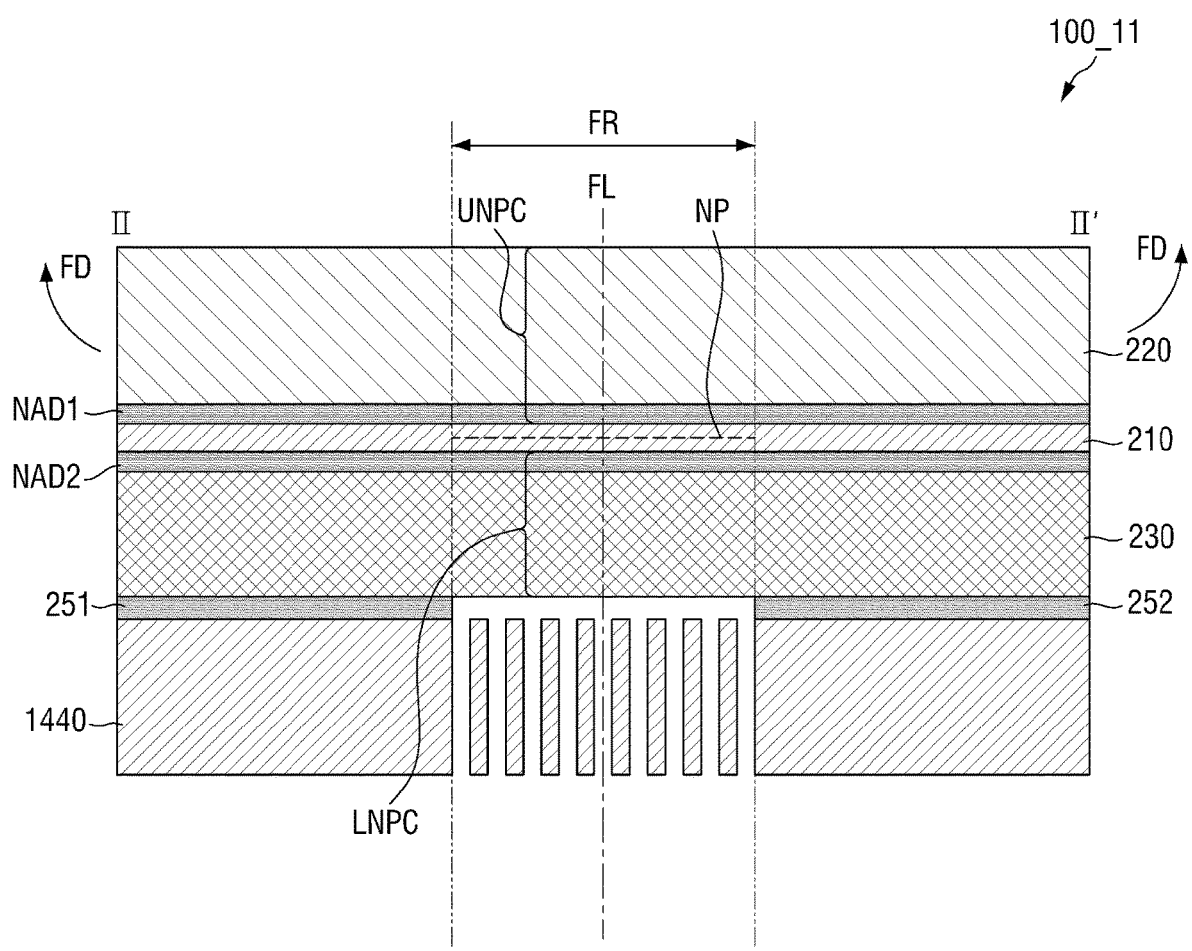

Referring to FIG. 14, a foldable display device 100_11 substantially differs from the foldable display device 100_10 of FIG. 13 in that it includes a plate 1440.

The plate 1440 includes holes in a folding region FR. The holes may be formed to penetrate the plate 1440 in a thickness direction and may be arranged in series in a left-to-right direction. Although not specifically illustrated in FIG. 14, in a folding region FR, the plate 1440 may have a mesh structure in a plan view. Accordingly, there is no need to form separate pores (or air passages connecting the gap between first and second double-sided adhesive films 251 and 252 and the outside) in the plate 1440.

Figure 15:
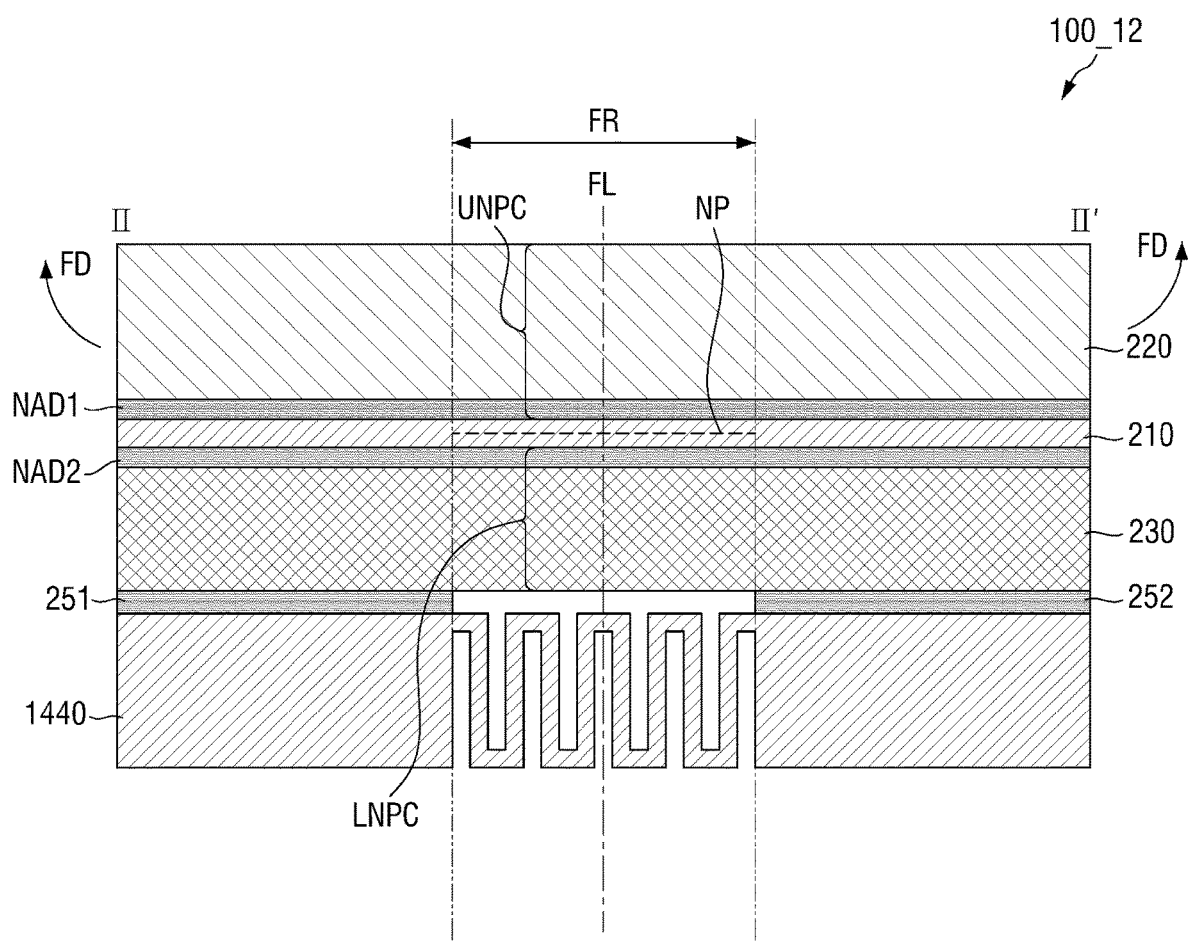

Referring to FIG. 15, a foldable display device 100_12 substantially differs from the foldable display device 100_11 of FIG. 14 in that it includes a plate 1540.

The plate 1540 may include grooves formed on the top surface and the bottom surface thereof. The grooves formed on the top surface of the plate 1540 may be arranged in a left-to-right direction. The grooves formed on the bottom surface of the plate 1540 may be arranged in the left-to-right direction to be staggered with the grooves formed on the top surface of the plate 1540. That is, in a cross-sectional view, the plate 1540 may have a zigzag pattern in the folding region FR.

Pores may be formed in the plate 1540.

Figure 16:
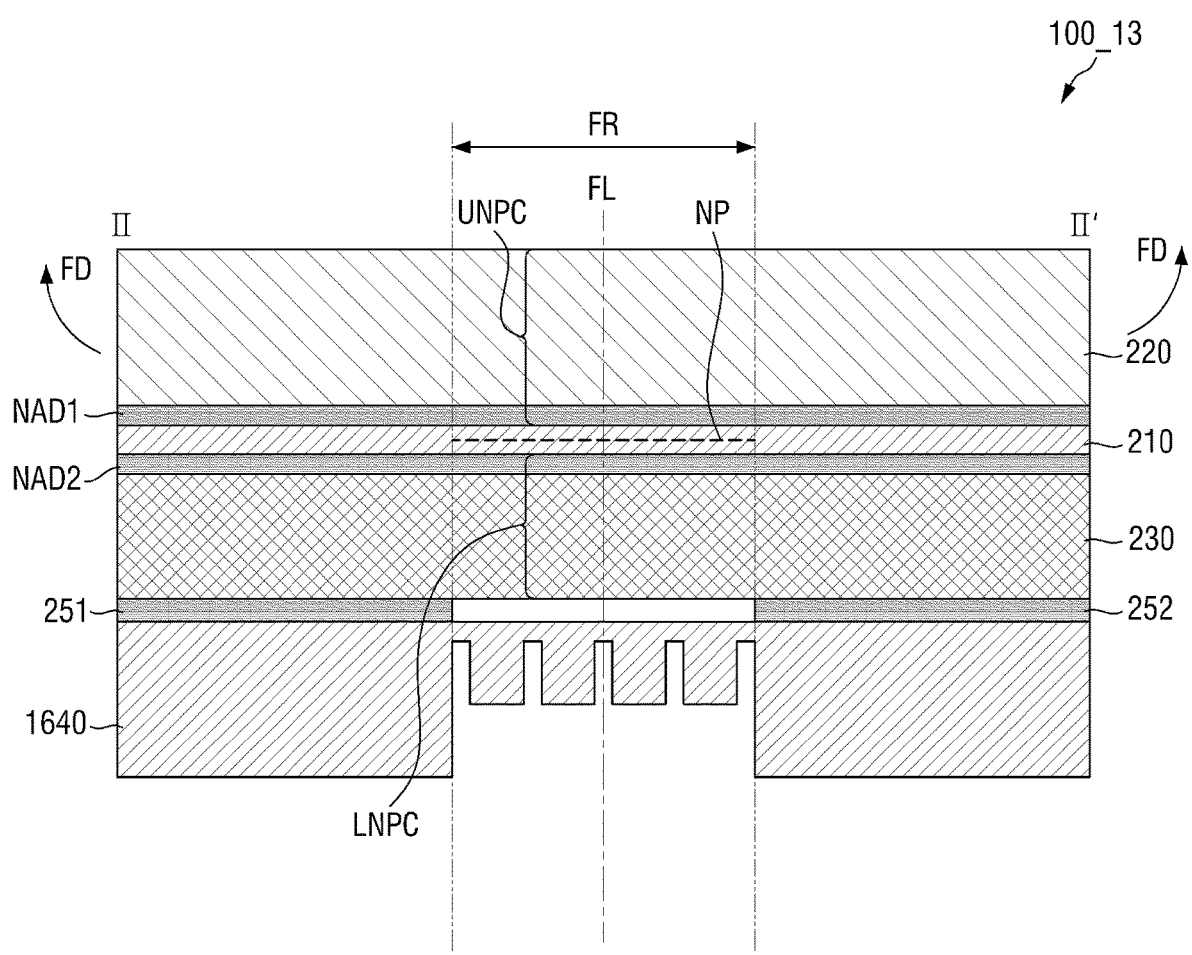

Referring to FIG. 16, a foldable display device 100_13 substantially differs from the foldable display device 100_12 of FIG. 15 in that it includes a plate 1640.

As described above with regard to the plate 1140 of FIG. 11, the entire bottom of the plate 1640 may be upwardly recessed in a folding region FR and may include grooves. By adjusting the density and width of, and the distance between, the grooves of the plate 1640, the foldability of the plate 1640 can be improved.

Pores may be formed in the plate 1540.

Figure 17:
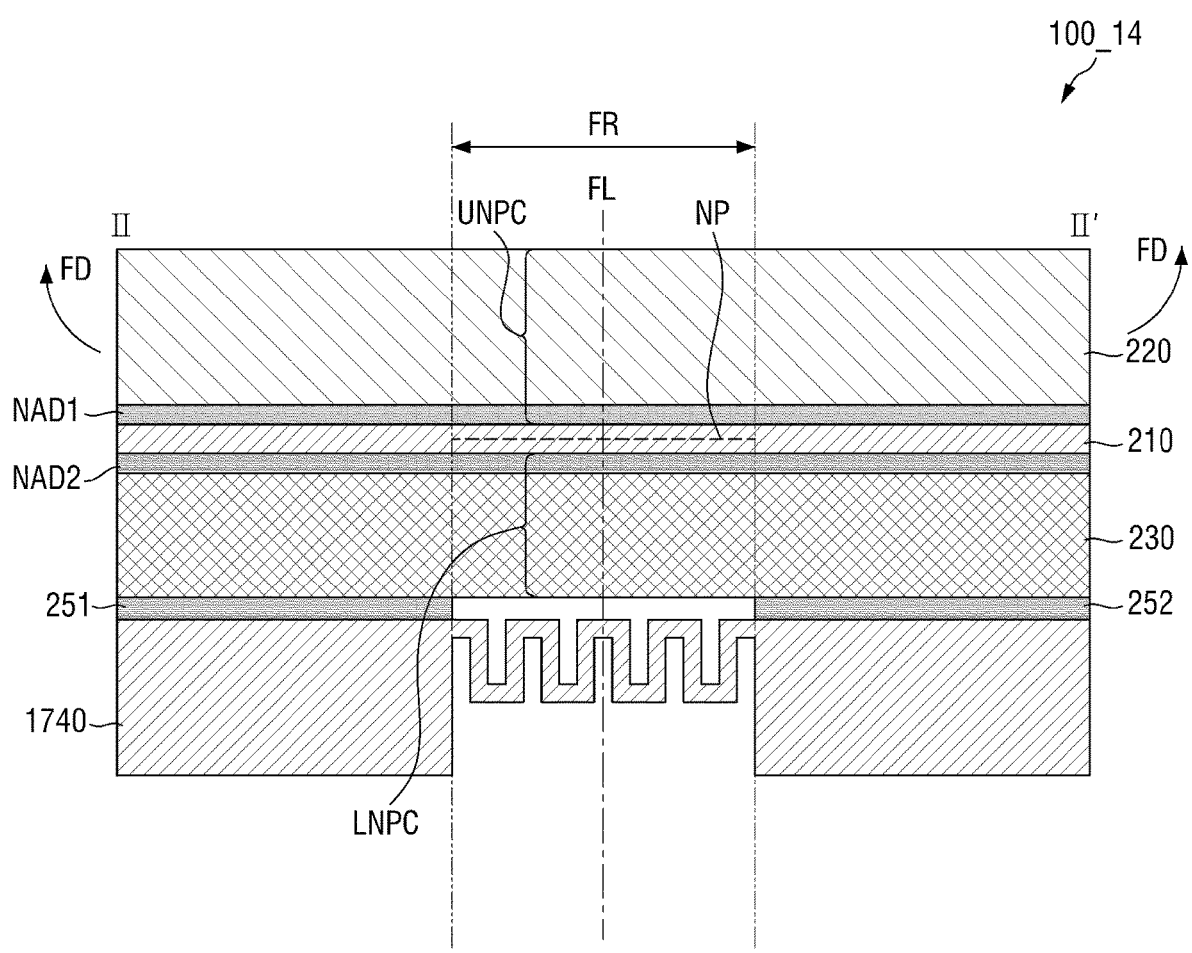

Referring to FIG. 17, a foldable display device 100_14 substantially differs from the foldable display device 100_13 in that it includes a plate 1740.

As described above with regard to the plate 1140 of FIG. 11, the entire bottom of the plate 1640 may be upwardly recessed in a folding region FR. The plate 1740, like the plate 1540 of FIG. 15, may include grooves formed on the top surface and the bottom surface thereof. In a cross-sectional view, the plate 1740, like the plate 1540 of FIG. 15, may have a zigzag pattern in the folding region FR.

Pores may be formed in the plate 1740.

Alternatively, the plate 1740 may include holes, instead of the grooves formed on both surfaces thereof, in the folding region FR and may have a mesh structure in a plan view.

Figure 18:
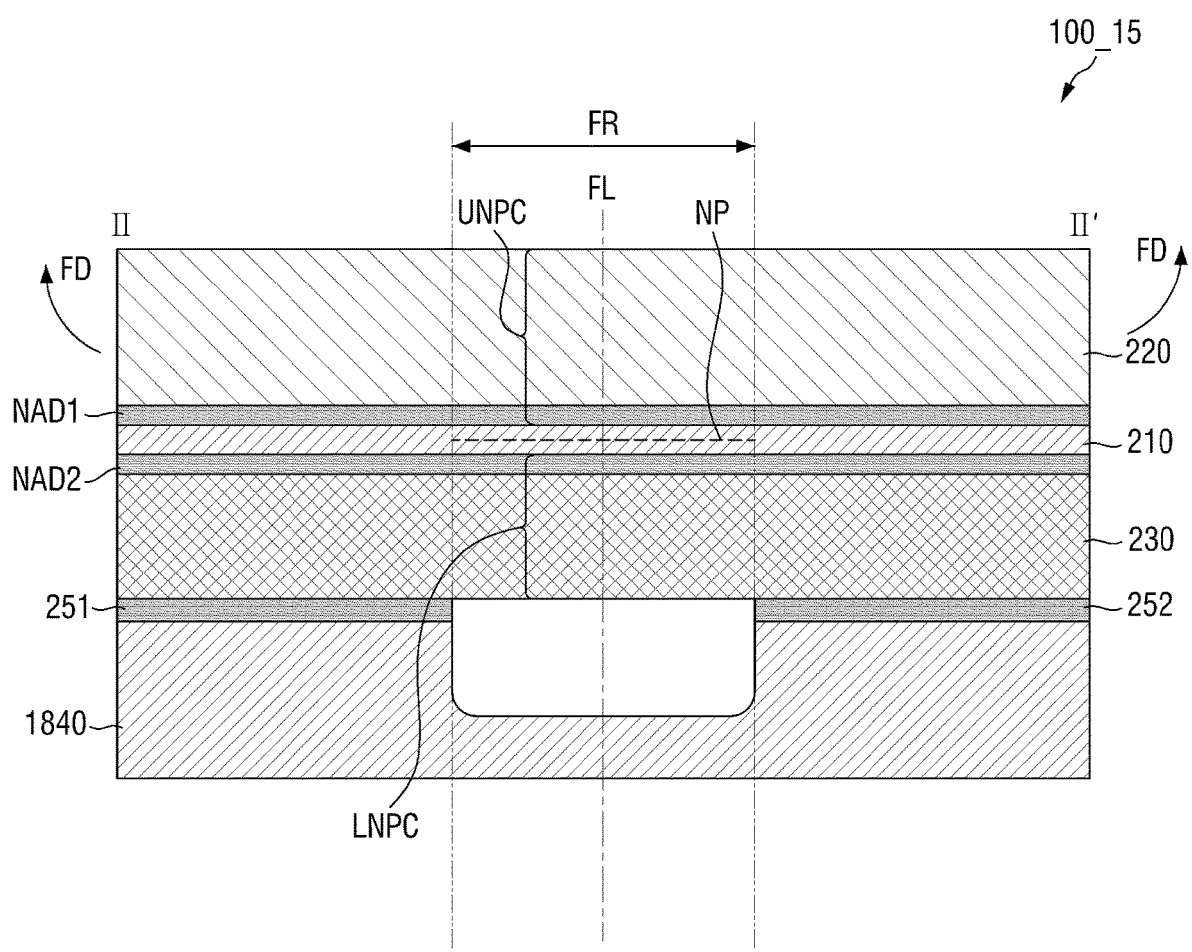

Referring to FIG. 18, a foldable display device 100_15 substantially differs from the foldable display device 100_14 of FIG. 17 in that it includes a plate 1840.

The plate 1840 may include a groove corresponding to a folding region FR on the top surface thereof. That is, in the folding region FR, the entire top of the plate 1840 may be downwardly recessed. Pores may be formed in the plate 1840.

Figure 19:
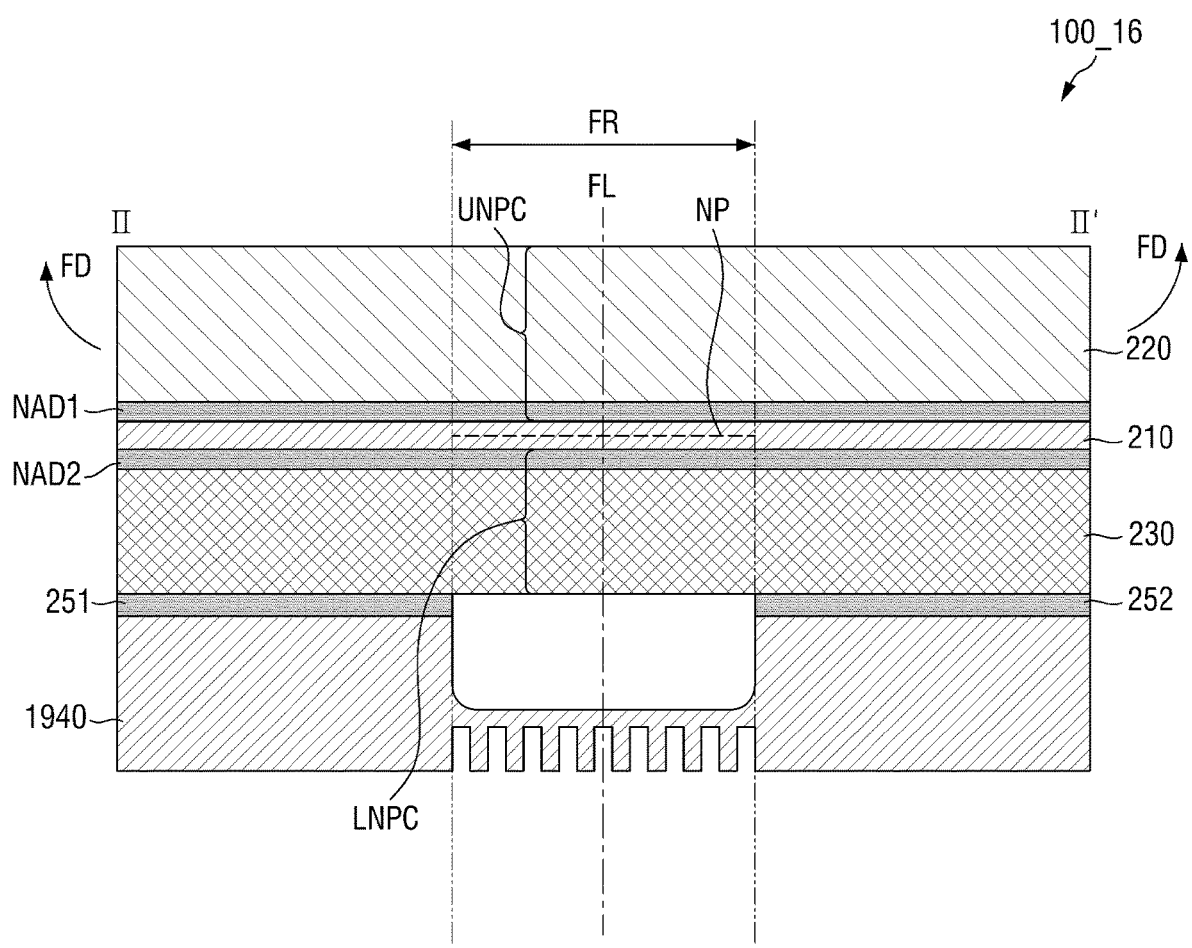

Referring to FIG. 19, a foldable display device 100_16 substantially differs from the foldable display device 100_15 of FIG. 18 in that it includes a plate 1940.

The plate 1940 may include a groove corresponding to a folding region FR on the top surface thereof. Also, the plate 1940 may include grooves formed on the bottom surface thereof. The grooves may be arranged in a left-to-right direction.

Pores may be formed in the plate 1940.

As described above with regard to the plate 1440 of FIG. 14, the plate 1940 may include holes, instead of the grooves, in the folding region FR and may have a mesh structure in a plan view.

Figure 20:
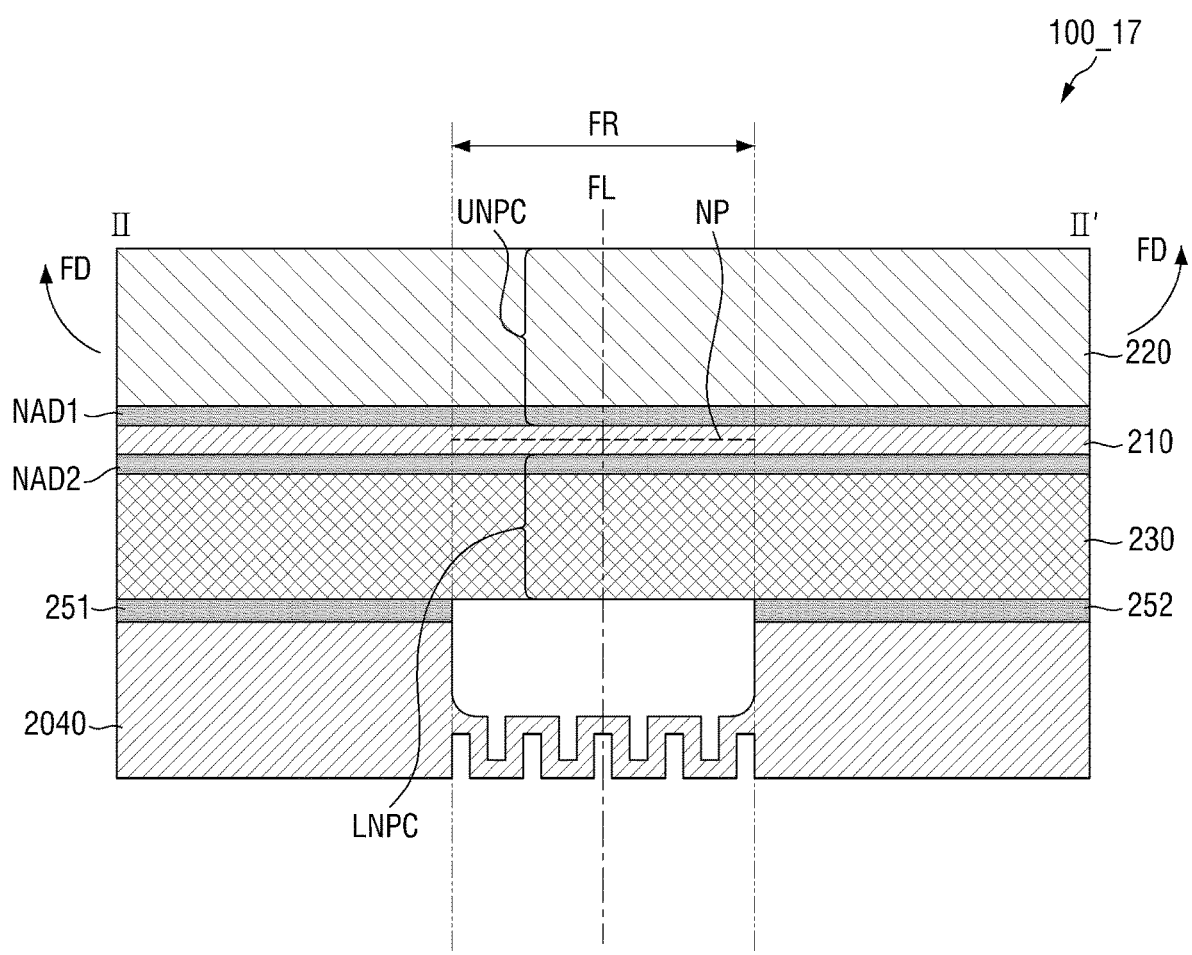

Referring to FIG. 20, a foldable display device 100_17 substantially differs from the foldable display device 100_16 of FIG. 19 in that it includes a plate 2040.

The plate 2040 may include a groove corresponding to a folding region FR on the top surface thereof. Also, the plate 2040 may include grooves formed on each of the top and bottom surfaces thereof. That is, in a cross-sectional view, the plate 2040 may have a zigzag pattern in the folding region FR.

Although not specifically illustrated in FIG. 20, pores may be formed in the plate 2040.

Figure 21:
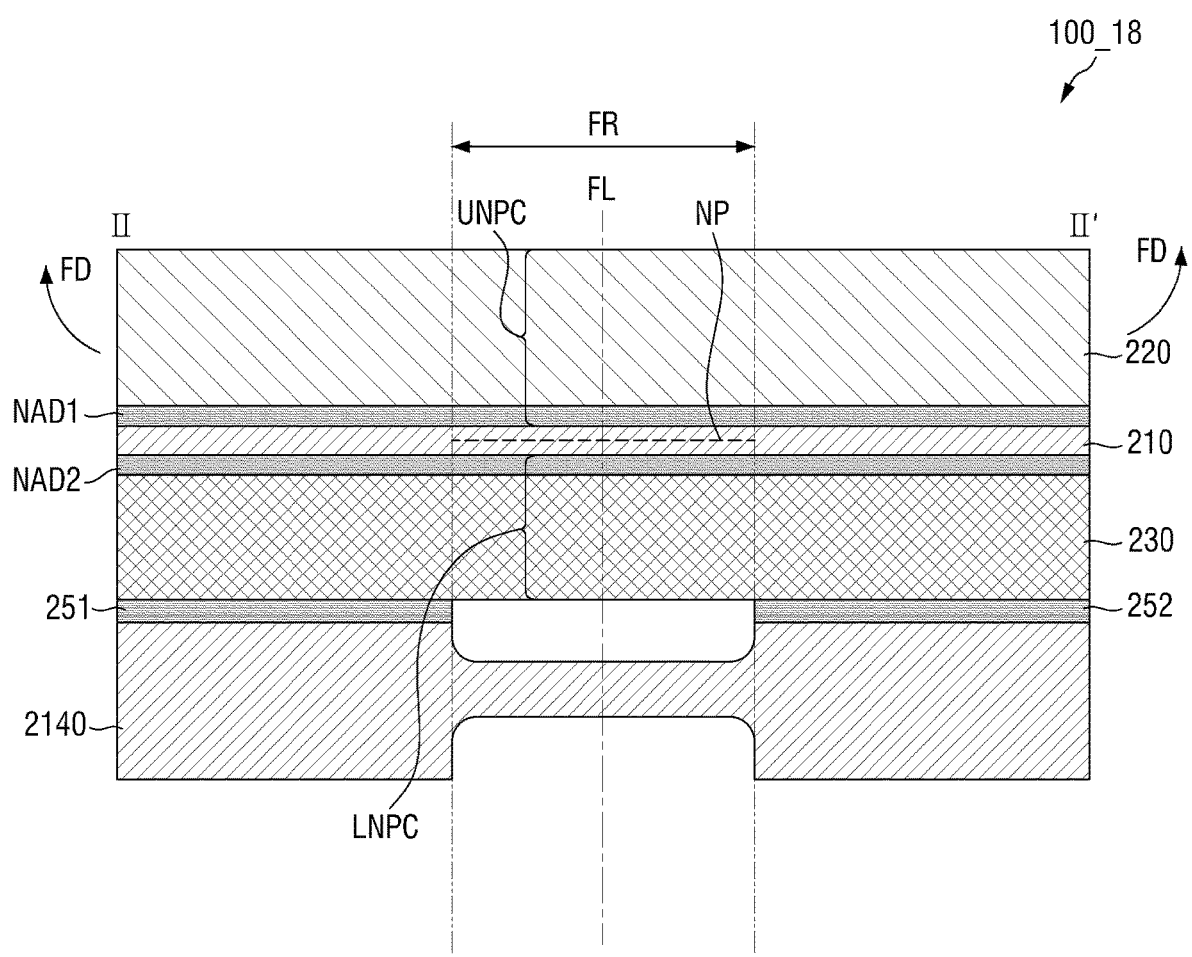

Referring to FIG. 21, a foldable display device 100_18 substantially differs from the foldable display device 100_17 of FIG. 20 in that it includes a plate 2140.

The plate 2140 may include a groove on each of the top and bottom surfaces thereof. In a folding region FR, the top of the plate 2140 may be downwardly recessed, and the bottom of the plate 2140 may be upwardly recessed. That is, the plate 2140 may have a substantial dumbbell shape in a cross-sectional view.

Although not specifically illustrated in FIG. 21, pores may be formed in the plate 2140.

Figure 22:
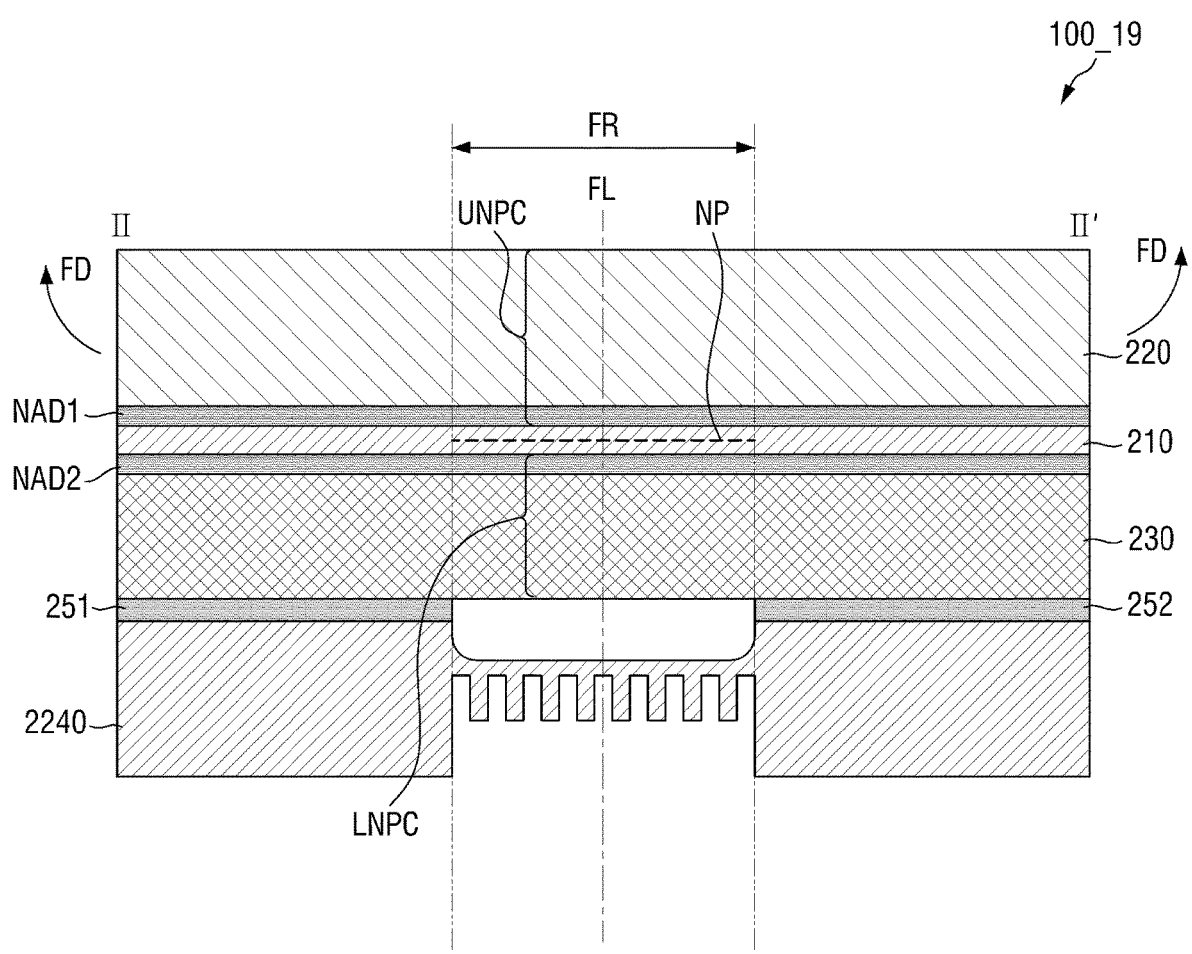

Referring to FIG. 22, a foldable display device 100_19 substantially differs from the foldable display device 100_18 of FIG. 21 in that it includes a plate 2240.

The plate 2240 has a substantial dumbbell shape in a cross-sectional view. In a folding region FR, the plate 2240 may include grooves formed on the bottom surface thereof. The grooves may be arranged in a left-to-right direction.

Pores may be formed in the plate 2240.

As described above with regard to the plate 1440 of FIG. 14, the plate 2240 may include holes, instead of the grooves, in the folding region FR and may have a mesh structure in a plan view.

Figure 23:
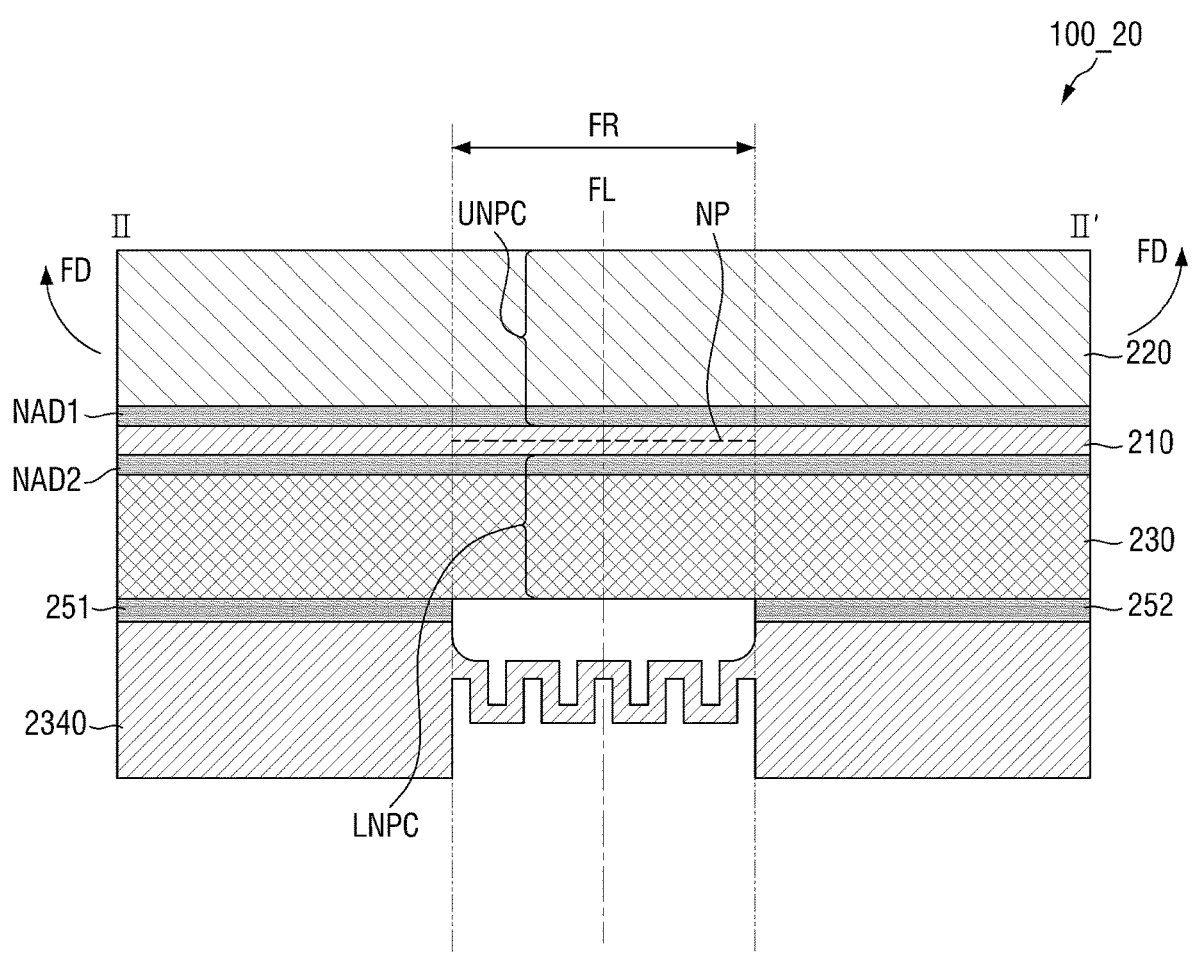

Referring to FIG. 23, a foldable display device 100_20 substantially differs from the foldable display device 100_19 of FIG. 22 in that it includes a plate 2340.

The plate 2340 has a substantial dumbbell shape in a cross-sectional view. In a folding region FR, the plate 2340 may include grooves formed on each of the top and bottom surfaces thereof. That is, in a cross-sectional view, the plate 2340 may have a zigzag pattern in the folding region FR.

Although not specifically illustrated in FIG. 23, pores may be formed in the plate 2340.

The effects of the invention are not limited by the foregoing, and other various effects are anticipated herein.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A foldable display device assembly, comprising:
a first plate having a first section, a second section, and a connection section connected between the first section and the second section, the first plate being foldable about a folding axis disposed between the first and second sections, the first section and the second section being rigid, the connection section having a foldability and a first width measured in a direction from the first section of the plate to the second section of the plate when the foldable display device assembly is unfolded;
a second plate disposed on the first plate;
a first double-sided adhesive film disposed on the second plate;
a flexible display module disposed on the first double-sided adhesive film, the flexible display module having an electroluminescent unit;
a second double-sided adhesive film disposed on the flexible display module; and
an upper flexible module disposed on the second double-sided adhesive film,
wherein the connection section of the first plate includes a recess having a thickness smaller than a thickness of the first section of the first plate and a thickness of the second section of the first plate, and
the second plate has a substantially lower light transmittance than the upper flexible module.

2. The foldable display device assembly of claim 1, further comprising a third double-sided adhesive film disposed between the first plate and the second plate,
wherein the third double-sided adhesive film extends substantially continuously over the first section of the first plate and the second section of the first plate.

3. The foldable display device assembly of claim 2, wherein a neutral plane having a width substantially smaller than the first width is substantially symmetrical with respect to the folding axis when the foldable display device assembly is folded or unfolded, and
the third double-sided adhesive film at least in part locates the neutral plane within a foldable region of the flexible display module.

4. The foldable display device assembly of claim 1, wherein the connection section of the first plate has a portion having an average thickness decreasing in the direction in which the first width is measured.

5. The foldable display device assembly of claim 1, wherein the recess of the connection section of the first plate is a downwardly opening recess.

6. The foldable display device assembly of claim 5, wherein the downwardly opening recess has at least one of a rounded inner corner and/or a rounded outer corner.

7. The foldable display device assembly of claim 5, wherein the recess of the connection section of the first plate is an upwardly opening recess.

8. The foldable display device assembly of claim 7, wherein the upwardly opening recess has a rounded inner corner.

9. The foldable display device assembly of claim 1, wherein the recess of the connection section of the first plate is an upwardly opening recess.

10. The foldable display device assembly of claim 9, wherein the upwardly opening recess has a rounded inner corner.

11. The foldable display device assembly of claim 1, further comprising a third double-sided adhesive film disposed between the first plate and the second plate,
wherein the third double-sided adhesive film comprises third and fourth sections separated from each other, the third section of the third double-sided adhesive film is disposed between the first section of the first plate and the second plate, and the fourth section of the third double-sided adhesive film is disposed between the second section of the first plate and the second plate.

12. The foldable display device assembly of claim 1, further comprising:
a buffer film disposed on the first plate; and
a third double-sided adhesive film disposed between the buffer film and the second plate,
wherein the buffer film prevents an adhesion between the third double-sided adhesive film and the first plate from decreasing due to a difference in a physical property between the first plate and the third double-sided adhesive film.

13. The foldable display device assembly of claim 12, wherein the buffer film comprises a non-metallic inorganic material.

14. The foldable display device assembly of claim 13, wherein the non-metallic inorganic material comprises silicon.

15. The foldable display device assembly of claim 13, wherein the first plate comprises a metal, and the third double-sided adhesive film comprises an organic material.

16. A foldable display device assembly, comprising:
- a first plate having a first section, a second section, and a connection section connected between the first section and the second section, the first plate being foldable about a folding axis disposed between the first and second sections;
- a second plate disposed on the first plate;
- a first double-sided adhesive film disposed on the second plate;
- a flexible display module disposed on the first double-sided adhesive film, the flexible display module having an electroluminescent unit;
- a second double-sided adhesive film disposed on the flexible display module; and
- an upper flexible module disposed on the second double-sided adhesive film,
- wherein the connection section of the first plate includes a recess having a thickness smaller than a thickness of the first section of the first plate and a thickness of the second section of the first plate, and
- the second plate has a substantially lower light transmittance than the upper flexible module.

* * * * *